(12) United States Patent
Lazaro et al.

(10) Patent No.: US 12,199,607 B2
(45) Date of Patent: Jan. 14, 2025

(54) POWER TRANSISTOR THERMAL CONTROL VIA INTEGRATED THERMOELECTRIC DEVICE

(71) Applicant: Texas Instruments Incorporated, Dallas, TX (US)

(72) Inventors: Orlando Lazaro, Cary, NC (US); Henry Litzmann Edwards, Garland, TX (US); Andres Arturo Blanco, Garland, TX (US); Kushal D. Murthy, Bangalore (IN); Ankur Chauhan, Kharapur (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/103,753

(22) Filed: Jan. 31, 2023

(65) Prior Publication Data
US 2024/0258999 A1    Aug. 1, 2024

(51) Int. Cl.
*H03K 3/011*    (2006.01)
*H01L 27/02*    (2006.01)
*H03K 17/687*    (2006.01)

(52) U.S. Cl.
CPC .......... *H03K 3/011* (2013.01); *H01L 27/0251* (2013.01); *H03K 17/687* (2013.01)

(58) Field of Classification Search
None
See application file for complete search history.

(56) References Cited

U.S. PATENT DOCUMENTS

2023/0155023 A1*   5/2023   Edwards ............. H01L 27/0617 257/343
2023/0157175 A1*   5/2023   Edwards ............. H01L 27/0617 257/470

\* cited by examiner

*Primary Examiner* — Jeffrey S Zweizig
(74) *Attorney, Agent, or Firm* — Andrew R. Ralston; Frank D. Cimino

(57) ABSTRACT

The present disclosure introduces integrated circuits and related manufacturing methods, wherein each integrated circuit includes an electronic device and a thermoelectric circuit. The electronic device is formed in and/or over a semiconductor substrate. The thermoelectric circuit includes thermopiles formed in and/or over the semiconductor substrate and electrically connected in series. The thermoelectric circuit is configured to modulate operation of the electronic device in response to a potential produced by the plurality of thermopiles.

21 Claims, 20 Drawing Sheets

POWER TRANSISTOR THERMAL CONTROL VIA INTEGRATED THERMOELECTRIC DEVICE

CROSS-REFERENCE TO RELATED APPLICATIONS

This application is related to U.S. patent application Ser. No. 17/528,990, filed Nov. 17, 2021, and U.S. patent application Ser. No. 17/538,238, filed Nov. 30, 2021, the contents of which are incorporated by reference in their entireties.

TECHNICAL FIELD

The present disclosure relates generally to power transistors in integrated circuits (ICs), and more particularly, but not exclusively, to a power transistor with an integrated thermal regulation and methods for making the same.

BACKGROUND OF THE DISCLOSURE

Power field-effect transistor (FET) arrays are subject to high-power and high-temperature stresses that can cause damage. Thermal runaway due to FET self-heating is an example. On-chip temperature sensors based on diodes are often used to prevent such high temperature stress, such as in over-temperature protection circuits. However, ambient or board temperature adds to the chip temperature, so the use of absolute temperature to trigger protection circuits may not accurately respond to thermal runaway. Moreover, existing power FET technology does not include integrated and/or otherwise sufficient means for measuring temperature gradients instead of absolute temperature.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces an integrated circuit that includes an electronic device and a thermoelectric circuit. The electronic device is formed in and/or over a semiconductor substrate. The thermoelectric circuit includes thermopiles formed in and/or over the semiconductor substrate and electrically connected in series. The thermoelectric circuit is configured to modulate operation of the electronic device in response to a potential produced by the plurality of thermopiles.

The present disclosure also introduces an integrated circuit that includes an array of transistors formed in or over a semiconductor substrate, a first thermoelectric circuit, and a second thermoelectric circuit. The array of transistors is formed in or over a semiconductor substrate and includes a first transistor and a second transistor. The first thermoelectric circuit modulates operation of the first transistor in response to a temperature gradient between the first transistor and the second transistor. The second thermoelectric circuit modulates operation of the second transistor in response to the temperature gradient.

The present disclosure also introduces a method of manufacturing an integrated circuit, including forming an electronic device in and/or over a semiconductor substrate and forming a thermoelectric circuit, including forming a plurality of series-connected thermopiles in and/or over the semiconductor substrate. The method also includes electrically connecting a control terminal of the electronic device and the thermoelectric circuit such that the electronic device is configured to operate dependent on a voltage produced by the electronic device.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
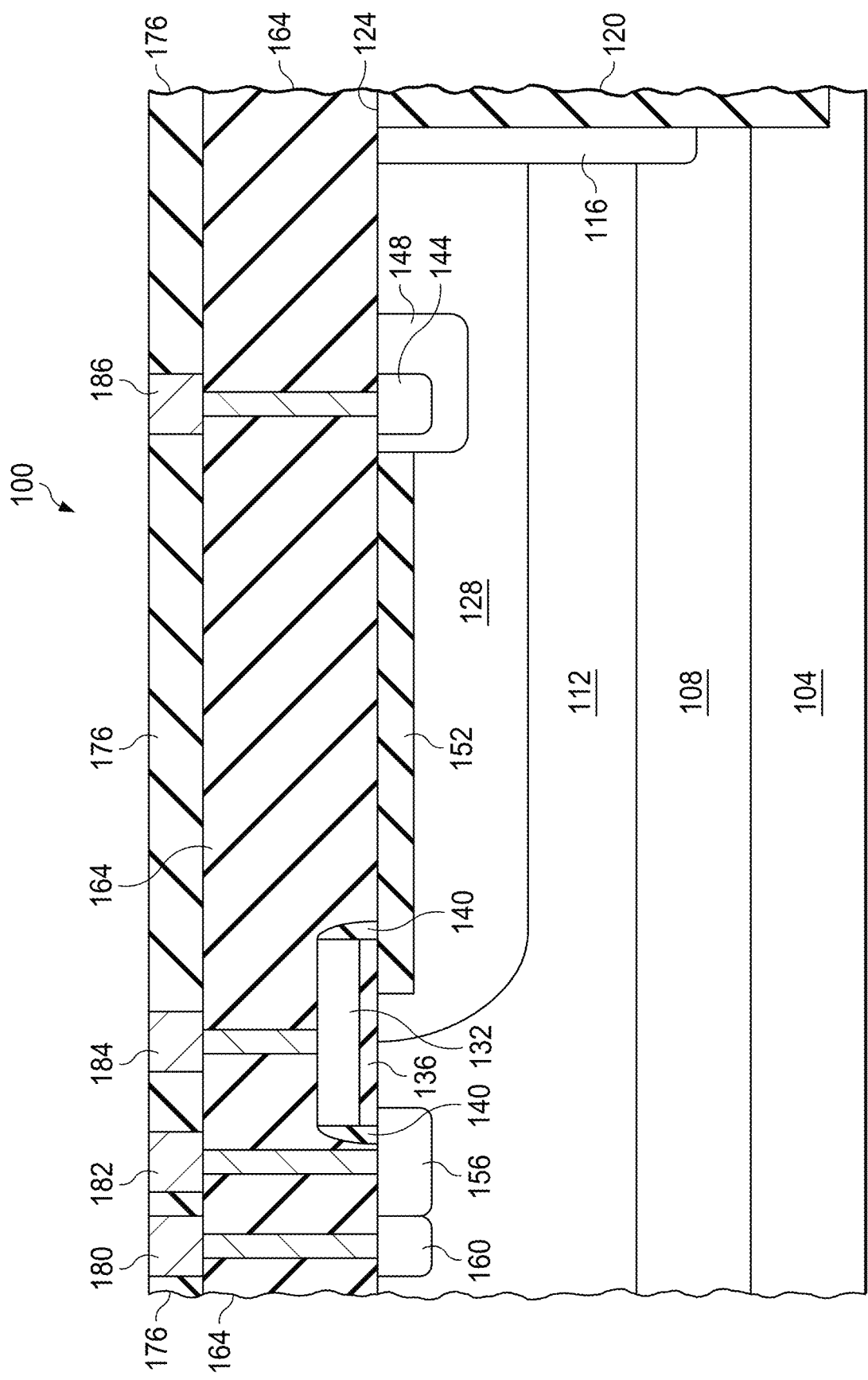
FIG. 1 is a schematic sectional view of a portion of an example implementation of a power transistor IC apparatus in an intermediate stage of manufacture according to one or more aspects of the present disclosure.

The following disclosure is described with reference to the attached figures. The figures are not drawn to scale, and they are provided merely to illustrate the disclosure. Several aspects of the disclosure are described below with reference to example implementations for illustration. It should be understood that numerous specific details, relationships, and methods are set forth to provide an understanding of the disclosure. However, the following disclosure is not limited by the illustrated ordering of acts or events, some of which may occur in different orders and/or concurrently with other acts or events, yet still fall within the scope of the following disclosure. Moreover, not all illustrated acts or events are required to implement a methodology in accordance with the following disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present disclosure illustrates by embodiments directed to example devices, it is not intended that these illustrations be a limitation on the scope or applicability of the various implementations. It is not intended that the example devices of the present disclosure be limited to the physical structures illustrated. These structures are included to demonstrate the utility and application of the present disclosure to example (and perhaps preferred) implementations.

It is also to be understood that the following disclosure may provide different examples for implementing different features of various implementations. Specific examples of components and arrangements are described below to simplify the present disclosure. These are, of course, merely examples and are not intended to be limiting. In addition, the following disclosure may repeat reference numerals and/or letters in more than one implementation. This repetition is for simplicity and clarity and does not in itself dictate a relationship between the various implementations and/or configurations discussed. Moreover, the formation of a first feature over or on a second feature in the description that follows may include implementations in which the first and second features are formed in direct contact and/or implementations in which additional features may be formed interposing the first and second features, such that the first and second features may not be in direct contact Various disclosed methods and devices of the present disclosure may be beneficially applied to integrated circuits that include a power transistor by providing thermal feedback to regulate the operation of the power transistor. While such examples may be expected to improve reliability of such circuits, e.g., by reducing the possibility of thermal runaway effects, no particular result is a requirement of the present invention unless explicitly recited in a particular claim.

FIG. 1 is a schematic sectional view of a portion of an example implementation of a power transistor IC apparatus in an intermediate stage of manufacture according to one or more aspects of the present disclosure. The power transistor IC apparatus includes a power transistor 100 constructed in a plurality of layers formed over a silicon, gallium arsenide, gallium nitride, silicon carbide, gallium nitride on silicon, and/or other semiconductor substrate (or "die") 104, which may be p-type, for example. The example power transistor 100 is described below as a lateral double-diffused metal-oxide-semiconductor field-effect transistor (LDMOS) built with a source-centered geometry, such as may be utilized as a buck converter, high-side, n-type power transistor contained within an n-type isolation tank. The power transistor 100 is an example power transistor that can be integrated with a thermoelectric device according to one or more aspects of the present disclosure. However, thermoelectric devices within the scope of the present disclosure may also be readily adapted for use with other transistors, such as LDMOS implementations other than as depicted in FIG. 1, as well as a metal-oxide-semiconductor field-effect transistor (MOSFET), a drain-extended MOSFET (DEMOS), a metal-insulator-semiconductor field-effect transistor (MISFET), a bipolar junction transistor, and/or other power transistors. Such power transistors may be either p-type or n-type transistors.

In the example implementation of FIG. 1, a p-type epitaxial layer may be formed over the semiconductor substrate 104. An n-type buried layer (NBL) 108 may be formed by implanting an n-type dopant into the epitaxial layer and driven (e.g., by thermal diffusion). A remaining portion of the epitaxial layer is a p-type epitaxial layer 112 that includes a buried portion and a channel region of the power transistor 100. The NBL 108 extends laterally to contact a deep n-type region (DEEPN) 116 implanted laterally from a deep trench 120 before the deep trench 120 is filled with dielectric material and/or doped polysilicon. The DEEPN 116 vertically extends from at least an upper surface 124 of an n-type deep well (DNWELL) 128 to the NBL 108, thereby forming an n-type isolation tank surrounding the power transistor 100. The deep trench 120 vertically extends from at least the upper surface 124 to the semiconductor substrate 104.

The DNWELL 128 extends laterally from the DEEPN 116 to underneath a gate structure comprising a polysilicon gate 132 (e.g., n-doped) overlying an oxide or other gate dielectric 136 and surrounded by dielectric sidewall spacers 140. An n+ doped drain 144 is implanted within a shallow n-type well (SNW) 148 that is implanted in the DNWELL 128. The drain 144 may instead be implanted directly in the DNWELL 128 absent the SNW 148. A shallow-trench isolation (STI) 152 may be deposited in the DNWELL 128 to extend laterally from the SNW 148 to underneath the gate structure, although other implementations may exclude the STI 152, such as for a lower-voltage rated LDMOS (e.g., when drain voltage (VD) is less than 12-20 volts (V), depending on details of the implementation). An n+ doped source 156 and a p+ doped back gate/body contact 160 are also implanted in the PBL 112.

A pre-metal dielectric (PMD) layer 164 is formed over the gate 132, the sidewall spacers 140, and the portions of the DNWELL 128, the drain 144, the SNW 148, the STI 152, the source 156, and the back gate/body contact 160. A dielectric layer (or multiple dielectric layers) 176 covers the PMD layer 164 and includes traces and other conductors connected to the terminals of the power transistor 100. For example, corresponding unreferenced vias connect: a connector 180 to the back gate/body contact 160; a connector 182 to the source 156; a connector 184 to the gate 132; and a connector 186 to the drain 144.

The present disclosure introduces integrating a thermoelectric device with the power transistor 100 (and/or other transistors), wherein the thermoelectric device is constructed in a same process flow used to form the power transistor 100. The thermoelectric device can be connected to circuitry to sense heat flux resulting from power dissipation of the power transistor 100, or an array of instances of the power transistor 100, whether such circuitry is on the power transistor chip or otherwise.

The thermoelectric device may include a thermocouple comprising an n-type thermopile ("n-thermopile") and a p-type thermopile ("p-thermopile"). Each thermopile is a section of semiconductor material, such as doped crystalline or polycrystalline silicon or another semiconductor. The opposing ends of such thermopiles, when placed in different temperatures, exhibit a voltage difference due to thermoelectric effects. The Seebeck coefficient is the relationship between the temperature differential and the resulting voltage difference sensed at the opposing ends of the thermopile. By combining two thermopiles of opposite Seebeck coefficient, where the thermopiles are connected electrically in series and generally arranged thermally in parallel, their Seebeck voltages constructively add and their electrical connections can be made at the same temperature node.

The p-thermopile comprises a p-type thermoelectric body (the thermoelectric portion) formed in a p-type one or more of the power transistor layers concurrently with the formation of one or more p-type features of the power transistor, such as the PBL 112 or the back gate/body contact 160. The n-thermopile comprises an n-type thermoelectric body formed in an n-type one or more of the power transistor layers concurrently with the formation of one or more n-type features of the power transistor, such as the NBL 108, the DEEPN 116, the n+ drain 144, the DNWELL 128, or the n+ source 156.

Figure 2:
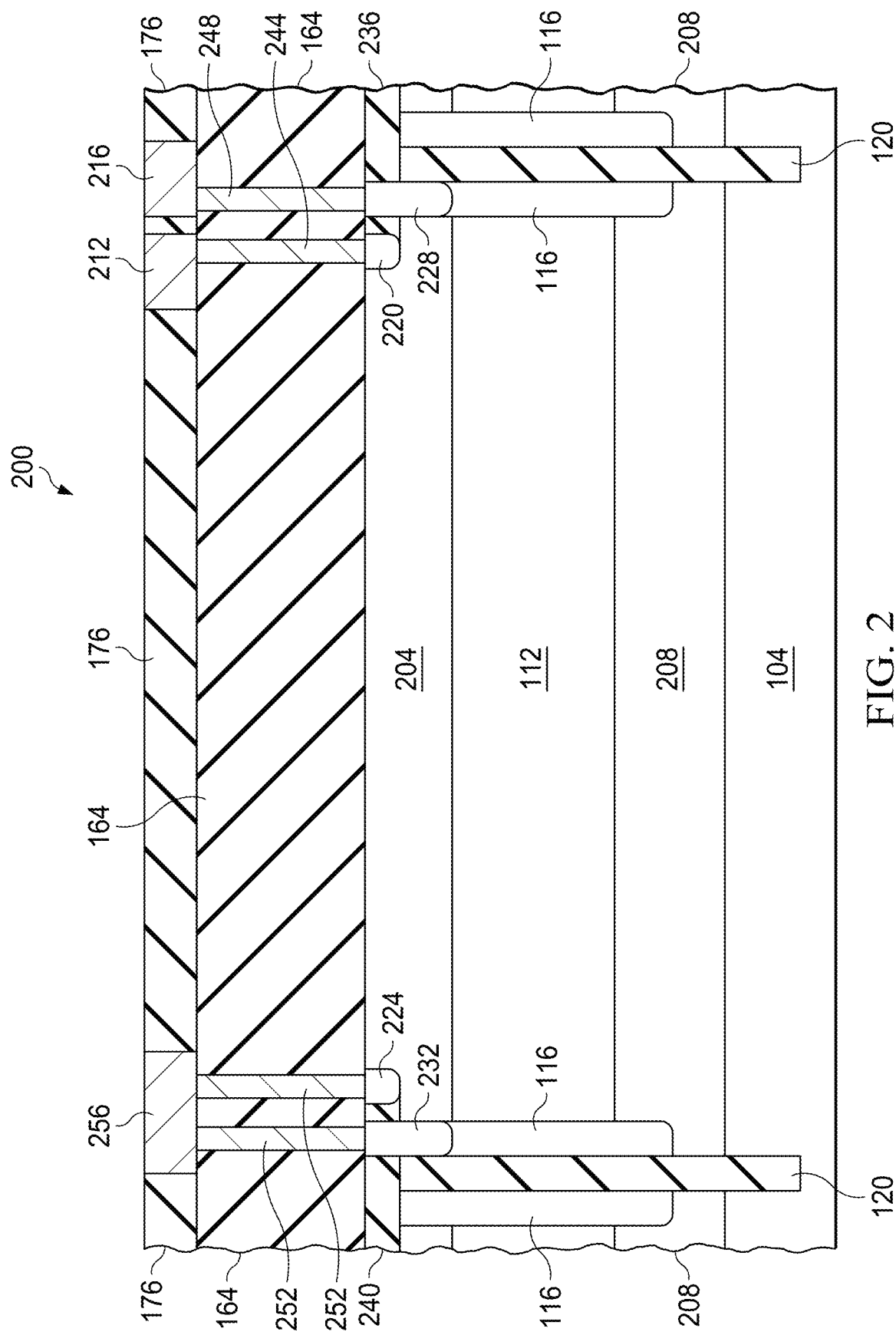
FIG. 2 is a schematic sectional view of a portion of an example implementation of a thermoelectric device in an intermediate stage of manufacture according to one or more aspects of the present disclosure.

FIG. 2 is a schematic sectional view of a portion of an example implementation of a thermoelectric device 200 in an intermediate stage of manufacture according to one or more aspects of the present disclosure. The thermoelectric device 200 is an example implementation that may be constructed concurrently with a power transistor such as the power transistor 100 depicted in FIG. 1 in a same process flow used to form the power transistor. Accordingly, the following description refers to FIGS. 1 and 2, collectively.

The thermoelectric device 200 is a trench-isolated, silicon-to-silicon thermocouple, meaning that the oppositely doped thermoelectric bodies are oppositely doped regions of crystalline silicon isolated from each other via opposing instances of the deep trench 120. For example, the thermoelectric device 200 includes a p-thermoelectric body 204 that is a p-type implanted region of crystalline silicon formed concurrently with a shallow p-type well (SPW) of the power transistor 100 (not shown in FIG. 1). The thermoelectric device 200 also includes an n-thermoelectric body 208 that is an n-type implanted region of crystalline silicon formed concurrently with the NBL 108 and/or other n-type features of the power transistor 100. The thermoelectric bodies 204, 208 are electrically isolated by the opposing deep trenches 120.

The thermoelectric device 200 includes a positive terminal 212 and a negative terminal 216, each formed concurrently with the conductors 180, 182, 184, 186, such as by deposition and subsequent planarization of aluminum, damascene copper, plated top copper, tungsten, a silicide (such as tungsten, vanadium, titanium, cobalt, nickel, or platinum), and/or other conductive materials. The p-type thermopile includes ohmic connections electrically connected to opposing ends of the p-type thermoelectric body 204. In the example implementation depicted in FIG. 2, such connections are a first p+ doped region 220 implanted in one end of the p-type thermoelectric body 204 and a second p+ doped region 224 implanted in the other end of the p-type thermoelectric body 204, each formed concurrently with a p-type source/drain region (PSD, not shown), the p+ back gate/body contact 160, and/or other p+ or other p-type features of the power transistor 100. The n-type thermopile similarly includes ohmic connections electrically connected to opposing ends of the n-type thermoelectric body 208. In the example implementation depicted in FIG. 2, such connections are a first n-doped region 228, connected to one end of the n-type thermoelectric body 208 by one portion of the DEEPN 116, and a second n-doped region 232, connected to the other end of the n-type thermoelectric body 208 by another portion of the DEEPN 116.

The first p+ doped region 220 and the first n-doped region 228 are electrically isolated by an STI 236. The second p+ doped region 224 and the second n-doped region 232 are electrically isolated by an STI 240. Each STI 236, 240 is formed concurrently with the STI 152 of the power transistor 100.

The first p+ doped region 220 is connected to the positive terminal 212 by a via 244 formed of tungsten or other conductive materials concurrently with the unreferenced vias shown in FIG. 1. The first n-doped region 228 is similarly connected by a via 248 to the negative terminal 216. The second p+ doped region 224 and the second n-doped region 232 are connected together by similar vias 252 and a conductor 256 formed concurrently with the terminals 212, 216.

The first p+ doped region 220 and the first n-doped region 228 forming the ohmic connections at one end of the respective p-thermoelectric body 204 and the n-thermoelectric body 208 are co-located. That is, such ohmic connections are set side by side or otherwise in close proximity (e.g., within five microns of each other, or within a distance from each other that is less than 30% of the largest dimension (e.g., along a longitudinal axis) of the thermoelectric bodies). The second p+ doped region 224 and the second n-doped region 232 forming the ohmic connections at the other end of the respective p-thermoelectric body 204 and the n-thermoelectric body 208 are similarly co-located. Accordingly, the p-type and n-type thermoelectric bodies 204, 208 each extend laterally between common first and second locations. Thus, the p-type and n-type thermoelectric bodies 204, 208 are arranged relative to each other and one or more instances of the power transistor 100 so as to experience substantially the same thermal gradient induced by operation of the power transistor(s) 100.

A trench-isolated, silicon-to-silicon thermocouple according to one or more aspects of the present disclosure is not limited to the example thermoelectric device 200 depicted in FIG. 2. For example, the p-type thermoelectric body may be formed concurrently with at least one other p-type feature of the power transistor, such as at least one of p-type epitaxial layer, a PBL, an SPW, a PSD, a p-type reduced surface electric field region (PRSRF), a p-type deep well (DP-WELL), and/or other p-type features. Similarly, the n-type thermoelectric body may be formed concurrently with at least one other n-type feature of the power transistor, such as at least one of an NBL, an n-type deep trench, an SNW, an n-type source/drain region (NSD), an n-type drift region (NDRIFT), a DEEPN, and/or other n-type features.

Figure 3:
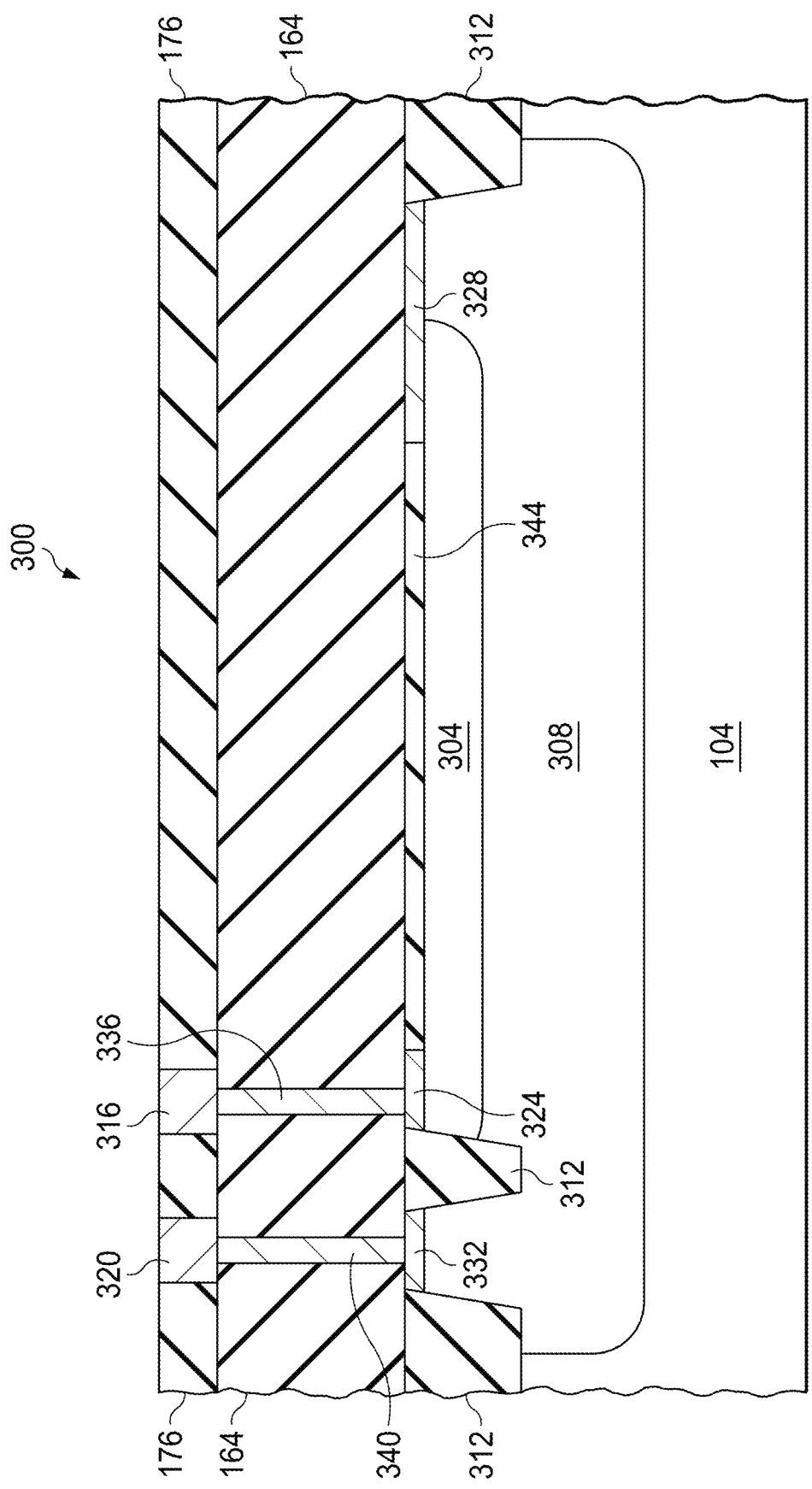
FIG. 3 is a schematic sectional view of a portion of another example implementation of a thermoelectric device in an intermediate stage of manufacture according to one or more aspects of the present disclosure.

FIG. 3 is a schematic sectional view of a portion of another example implementation of a thermoelectric device 300 in an intermediate stage of manufacture according to one or more aspects of the present disclosure. The thermoelectric device 300 is another example implementation that may be constructed concurrently with, and in a same process flow used to form, a power transistor such as the power transistor 100 depicted in FIG. 1. Accordingly, the following description refers to FIGS. 1 and 3, collectively.

The thermoelectric device 300 is an STI-isolated, silicon-to-silicon thermocouple, meaning that the oppositely doped thermoelectric bodies are oppositely doped regions of crystalline silicon isolated via one or more STI features. For example, the thermoelectric device 300 includes a p-thermopile having a p-thermoelectric body 304 that is a p+ implanted region of crystalline silicon formed concurrently with a PSD, the p+ back gate/body contact 160, and/or other p+ or other p-type features of the power transistor 100. The thermoelectric device 300 also includes an n-thermopile having an n-thermoelectric body 308 that is an n-type implanted region of crystalline silicon formed concurrently with the SNW 148 and/or other n-type features of the power transistor 100. The n-thermoelectric body 308 is implanted in the p-type semiconductor substrate 104, although the n-thermoelectric body 308 may instead be implanted in the PBL 112, a p-type epitaxial layer (p-epi, not shown in the figures), and/or other p-type features of the power transistor 100. The thermoelectric bodies 304, 308 are electrically isolated by one or more STI features 312 formed concurrently with the STI 152.

The thermoelectric device 300 includes a positive terminal 316 and a negative terminal 320, each formed concurrently with the conductors 180, 182, 184, 186, such as by deposition and subsequent planarization of aluminum, damascene copper, plated top copper, tungsten, a silicide (such as tungsten, vanadium, titanium, cobalt, nickel, or platinum), and/or other conductive materials. Ohmic connections are electrically connected to opposing ends of the p-type thermoelectric body 304. In the example implementation depicted in FIG. 3, such connections are a first silicide contact 324 deposited on one end of the p-type thermoelectric body 304 and a second silicide contact 328 deposited on the other end of the p-type thermoelectric body 304. Ohmic connections are similarly electrically connected to opposing ends of the n-type thermoelectric body 308. In the example implementation depicted in FIG. 3, such connections are a third silicide contact 332 and the second silicide contact 328, such that the second silicide contact 328 connects one end of the p-type thermoelectric body 304 to the co-located end of the n-thermoelectric body 308. At the opposing co-located ends of the thermoelectric bodies 304, 308, a via 336 connects the first silicide contact 324 to the positive terminal 316 and another via 340 connects the third silicide contact 332 to the negative terminal 320. As with the thermoelectric device 200 shown in FIG. 2, the thermoelectric bodies 304, 308 are arranged relative to each other and one or more instances of the power transistor 100 so as to experience substantially the same thermal gradient induced by operation of the power transistor(s) 100.

The vias 336, 340 are formed concurrently with the unreferenced vias of the power transistor 100 shown in FIG. 1, whereas the silicide contacts 324, 328, 332 are formed concurrently with silicide features of the power transistor 100 (not shown). The thermoelectric device 300 also includes a silicide blocking layer 344 deposited over a substantial portion (e.g., at least 90%) of the surface area of the p-thermoelectric body 304 to prevent the silicide from disrupting the intended thermoelectric function of the p-thermoelectric body 304.

Figure 4:
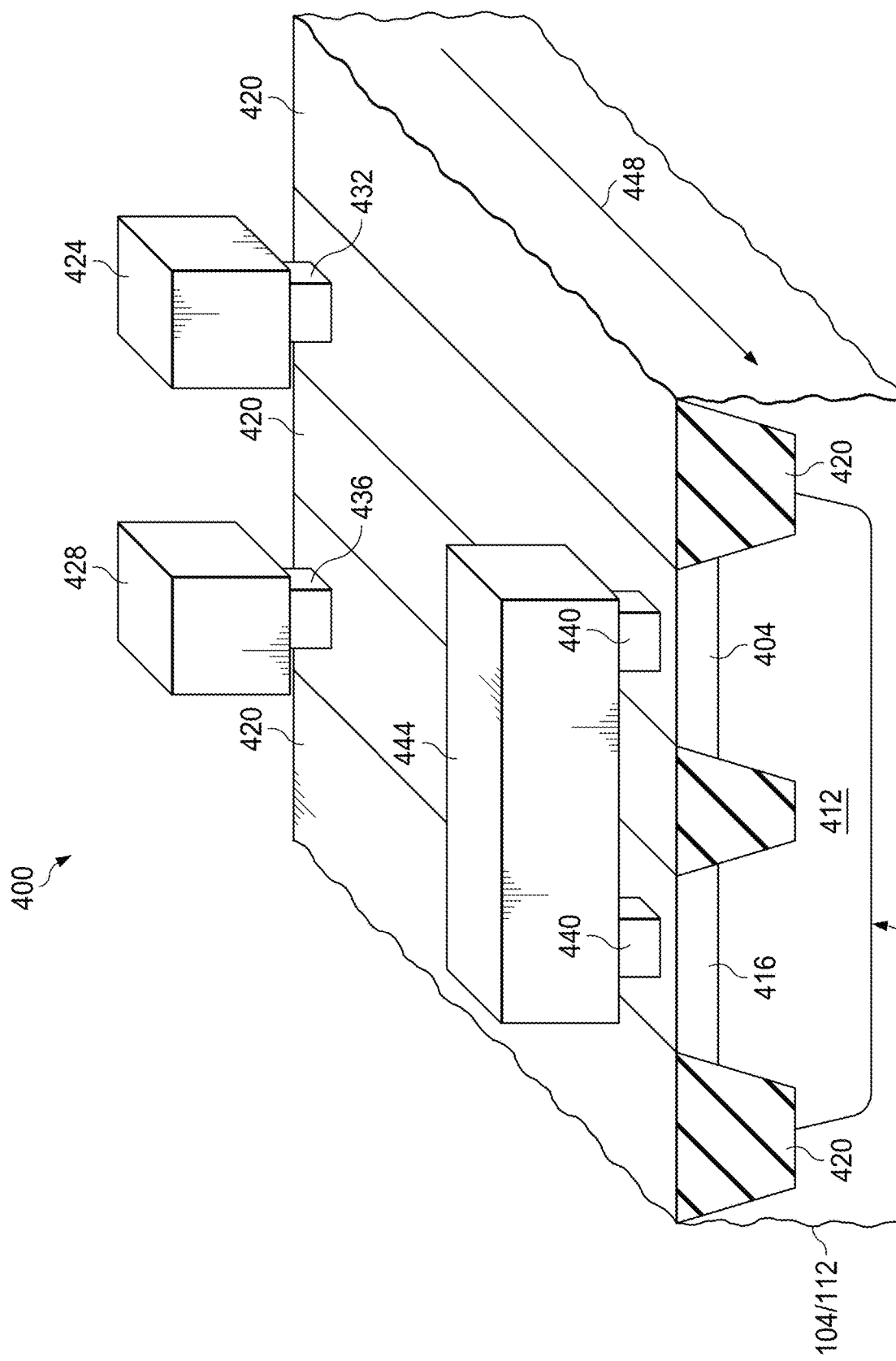
FIG. 4 is a schematic sectional and perspective view of a portion of another example implementation of a thermoelectric device in an intermediate stage of manufacture according to one or more aspects of the present disclosure.

FIG. 4 is a schematic sectional and perspective view of a portion of another example implementation of a thermoelectric device 400 in an intermediate stage of manufacture according to one or more aspects of the present disclosure. The thermoelectric device 400 is another example implementation that may be constructed concurrently with, and in a same process flow used to form, a power transistor such as the power transistor 100 depicted in FIG. 1. Accordingly, the following description refers to FIGS. 1 and 4, collectively.

The thermoelectric device 400 is an STI-isolated, silicon thermocouple, meaning that the oppositely doped thermoelectric bodies are oppositely doped portions of the same region of crystalline silicon, wherein the oppositely doped portions are electrically isolated via one or more STI features. For example, the thermoelectric device 400 includes a p-thermoelectric body 404 that is a p-type implanted region of crystalline silicon formed concurrently with a PSD, the p+ back gate/body contact 160, and/or other p+ or other p-type features of the power transistor 100. The thermoelectric device 400 also includes an n-thermoelectric body 408 that includes two n-type implanted regions 412, 416 of crystalline silicon. The n-type region 412 is formed concurrently with the SNW 148 and/or other n-type features of the power transistor 100, whereas the n-type region 416 is formed concurrently with the n+ drain 144, the n+ source 156, and/or other n-type features of the power transistor 100. The n-thermoelectric body 408 is implanted in the p-type semiconductor substrate 104, the PBL 112, and/or other p-type features of the power transistor 100. The thermoelectric bodies 404, 408 are electrically isolated by STI features 420 formed concurrently with the STI 152.

The thermoelectric device 400 includes a positive terminal 424 and a negative terminal 428, each formed concurrently with the conductors 180, 182, 184, 186, such as by deposition and subsequent planarization of aluminum, damascene copper, plated top copper, tungsten, a silicide (such as tungsten, vanadium, titanium, cobalt, nickel, or platinum), and/or other conductive materials. One or more vias, traces, silicide regions, and/or other conductive features 432 connect one end of the p-thermoelectric body 404 to the positive terminal 424, one or more such conductive features 436 connect the co-located end of the n-thermoelectric body 408 to the negative terminal 428, and one or more such conductive features 440 connect each of the other co-located ends of the thermoelectric bodies 404, 408 to a conductor 444 so as to connect said other co-located ends. The conductive features 432, 436, 440, 444 are formed concurrently with interconnect features of the power transistor 100.

As with the thermoelectric devices 200, 300 shown in FIGS. 2 and 3, the thermoelectric bodies 404, 408 are arranged relative to each other and one or more instances of the power transistor 100 so as to experience substantially the same thermal gradient induced by operation of the power transistor(s) 100. The thermal gradient is depicted in FIG. 4 by arrow 448, indicating the direction of increasing temperature. As also depicted in FIG. 4, the terminals 424, 428 are co-located at the cooler end of the thermoelectric device 400, so that the voltage of the thermoelectric device 400 can advantageously be detected at the cooler temperature. Co-locating the terminals 424, 428 may aid in avoiding thermoelectric potential differences in the metal connections, because although the Seebeck coefficient of such metal components is much smaller than for semiconductor materials, the metal connections may nonetheless cause errors. Additionally, for implementations that utilize an integrated thermoelectric device to monitor and/or manage thermal self-heating and/or runaway situations (and other implementations within the scope of the present disclosure), locating the terminals 424, 428 at the cooler ends of the thermoelectric bodies 404, 408 may aid in maintaining the accuracy and/or other aspects of the readout electronics (not shown) utilized to sense voltage at the terminals 424, 428, because such readout electronics may be less accurate at higher temperatures and/or the temperature at the warmer ends of the thermoelectric bodies 404, 408 may vary significantly more than at the cooler ends.

An STI-isolated, silicon thermoelectric device according to one or more aspects of the present disclosure is not limited to the example thermoelectric device 400 shown in FIG. 4. For example, one (or each) of the p-type and n-type thermoelectric bodies may be formed concurrently with two other respective p-type or n-type features of the power transistor that are not formed concurrently. An example of such implementation includes a p-type thermoelectric body formed concurrently with both an implanted PSD and a p-type moat region (PMOAT) subsequently implanted around the PSD, or a p-type thermoelectric body formed concurrently with both an implanted DPWELL and a PSD subsequently implanted in the DPWELL. However, other implementations are also within the scope of the present disclosure.

Figure 5:
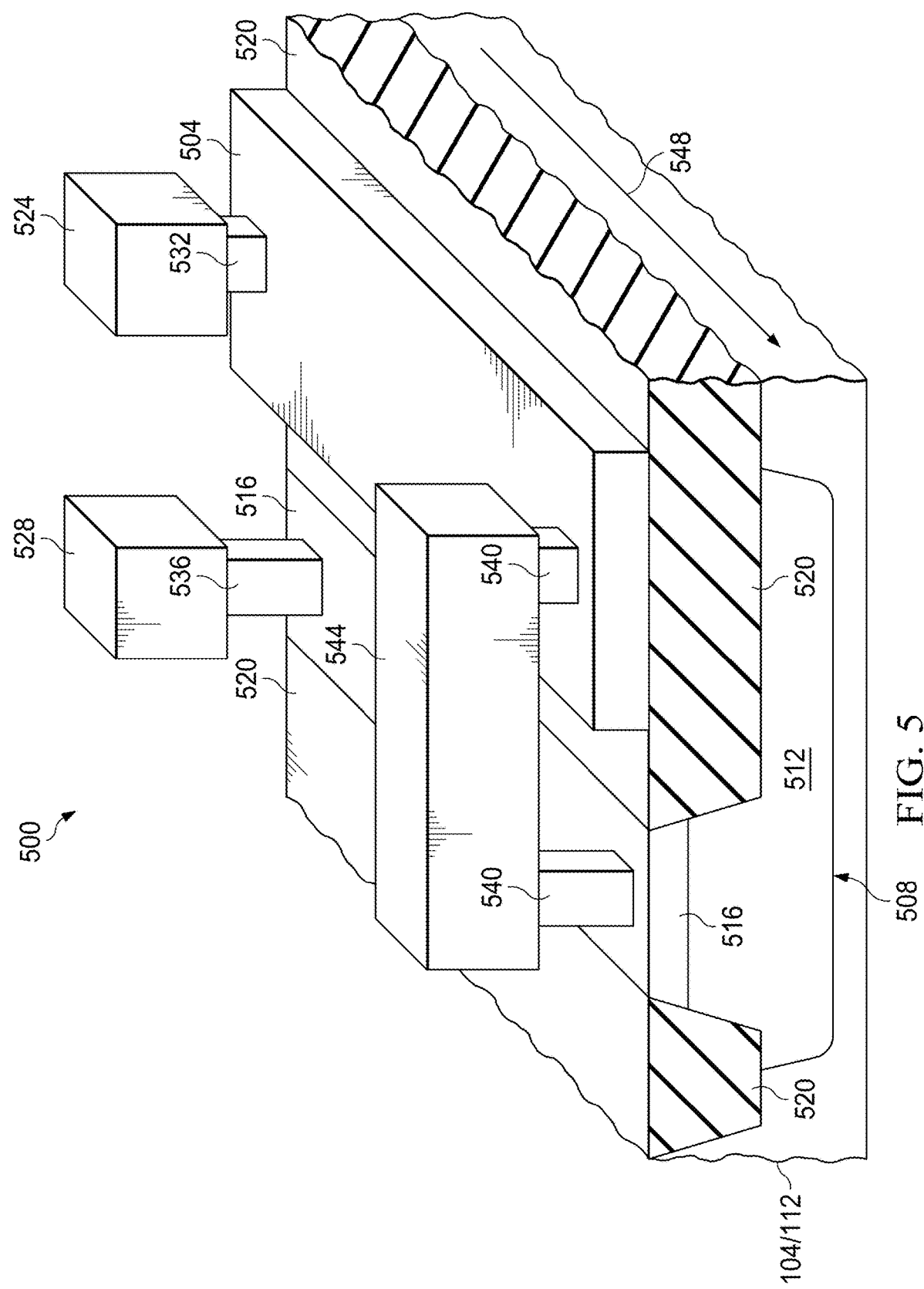
FIG. 5 is a schematic sectional and perspective view of a portion of another example implementation of a thermoelectric device in an intermediate stage of manufacture according to one or more aspects of the present disclosure.

FIG. 5 is a schematic sectional and perspective view of a portion of another example implementation of a thermoelectric device 500 in an intermediate stage of manufacture according to one or more aspects of the present disclosure. The thermoelectric device 500 is another example implementation that may be constructed concurrently with, and in a same process flow used to form, a power transistor such as the power transistor 100 depicted in FIG. 1. Accordingly, the following description refers to FIGS. 1 and 5, collectively.

The thermoelectric device 500 is an STI-isolated, silicon-to-polysilicon thermocouple, wherein the oppositely doped thermoelectric bodies include a crystalline silicon region doped opposite to a polysilicon region that is electrically isolated from the crystalline silicon region by one or more STI features. For example, the thermoelectric device 500 includes a p-thermoelectric body 504 that is a p-type region of polysilicon implanted concurrently with a PSD, a p-type deep well (DPWELL), the p+ back gate/body contact 160, and/or other p+ or other p-type features of the power transistor 100. The thermoelectric device 500 also includes an n-thermoelectric body 508 that includes two n-type implanted regions 512, 516 of crystalline silicon. The n-type region 512 is formed concurrently with the SNW 148 and/or other n-type features of the power transistor 100, whereas the n-type region 516 is formed concurrently with the n+ drain 144, the n+ source 156, and/or other n-type features of the power transistor 100. The n-thermoelectric body 508 is implanted in the p-type semiconductor substrate 104, the PBL 112, and/or other p-type features of the power transistor 100. The thermoelectric bodies 504, 508 are isolated by STI features 520 formed concurrently with the STI 152.

The thermoelectric device 500 includes a positive terminal 524 and a negative terminal 528, each formed concurrently with the conductors 180, 182, 184, 186. One or more vias, traces, silicide region, and/or other conductive features 532 connect one end of the p-thermoelectric body 504 to the positive terminal 524, one or more such conductive features 536 connect the co-located end of the n-thermoelectric body 508 to the negative terminal 528, and one or more such conductive features 540 connect each of the other co-located ends of the thermoelectric bodies 504, 508 to a conductor 544 so as to connect said other co-located ends. The conductive features 532, 536, 540, 544 are formed concurrently with other interconnect features of the power transistor 100.

As with the thermoelectric devices 200, 300, 400 shown in FIGS. 2-4, the thermoelectric bodies 504, 508 are arranged relative to each other and one or more instances of the power transistor 100 so as to experience substantially the same thermal gradient induced by operation of the power transistor(s) 100. The thermal gradient is depicted in FIG. 5 by arrow 548, indicating the direction of increasing temperature. As also depicted in FIG. 5, the terminals 524, 528 are located at the cooler end of the thermoelectric device 500, so that the voltage of the thermoelectric device 500 can advantageously be detected at the cooler temperature.

An STI-isolated, silicon-to-polysilicon thermoelectric device according to one or more aspects of the present disclosure is not limited to the example thermoelectric device 500 shown in FIG. 5. For example, one (or each) of the p-type and n-type thermoelectric bodies may be formed concurrently with two other respective p-type or n-type features of the power transistor that are not formed concurrently. An example of such implementation includes a p-type thermoelectric body formed concurrently with both an implanted DPWELL and a PSD subsequently implanted in the DPWELL. However, other implementations are also within the scope of the present disclosure.

Figure 6:
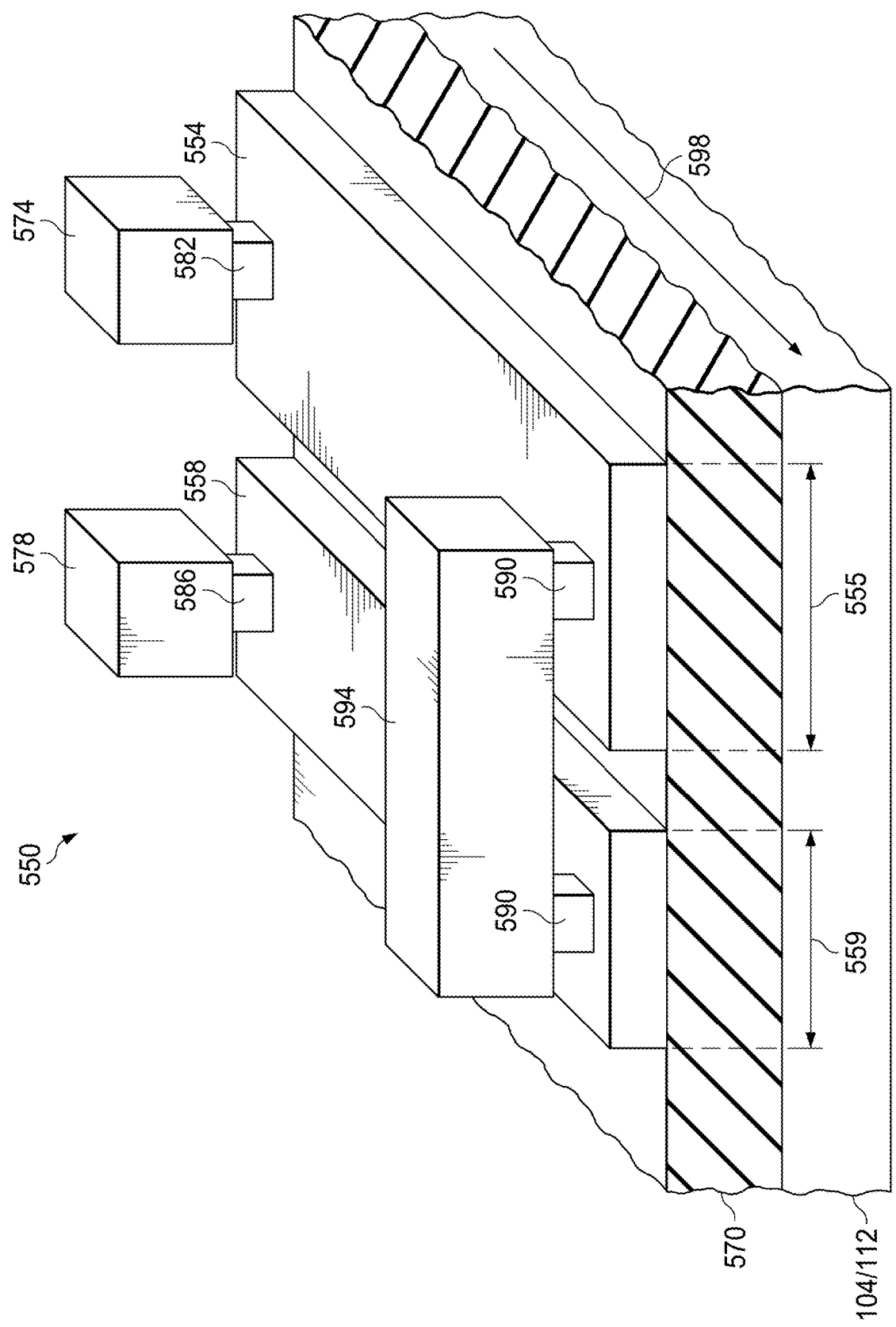
FIG. 6 is a schematic sectional and perspective view of a portion of another example implementation of a thermoelectric device in an intermediate stage of manufacture according to one or more aspects of the present disclosure.

FIG. 6 is a schematic sectional and perspective view of a portion of another example implementation of a thermoelectric device 550 in an intermediate stage of manufacture according to one or more aspects of the present disclosure. The thermoelectric device 550 is another example implementation that may be constructed concurrently with, and in a same process flow used to form, a power transistor such as the power transistor 100 depicted in FIG. 1. Accordingly, the following description refers to FIGS. 1 and 6, collectively.

The thermoelectric device 550 is an STI-isolated, polysilicon-to-polysilicon thermocouple, wherein the oppositely doped thermoelectric bodies include oppositely doped polysilicon regions electrically isolated by one or more STI features. For example, the thermoelectric device 550 includes a p-thermoelectric body 554 that is a p-type region of polysilicon implanted concurrently with one or more of a PSD, a p-type deep well (DPWELL), the p+ back gate/body contact 160, and/or other p+ or other p-type features of the power transistor 100. The thermoelectric device 550 also includes an n-thermoelectric body 558 that is an n-type region of polysilicon implanted concurrently with one or more of the SNW 148, the n+ drain 144, the n+ source 156, and/or other n-type features of the power transistor 100. The thermoelectric bodies 554, 558 are electrically isolated by one or more STI features 570 formed concurrently with the STI 152.

The thermoelectric device 550 includes a positive terminal 574 and a negative terminal 578, each formed concurrently with the conductors 180, 182, 184, 186. One or more vias, traces, silicide regions, and/or other conductive features 582 connect one end of the p-thermoelectric body 554 to the positive terminal 574, one or more such conductive features 586 connect the co-located end of the n-thermoelectric body 558 to the negative terminal 578, and one or more such conductive features 590 connect each of the other co-located ends of the thermoelectric bodies 554, 558 to a conductor 594 so as to connect said other co-located ends. The conductive features 582, 586, 590, 594 are formed concurrently with other interconnect features of the power transistor 100.

As with the thermoelectric devices 200, 300, 400, 500 shown in FIGS. 2-5, the thermoelectric bodies 554, 558 are arranged relative to each other and one or more instances of the power transistor 100 so as to experience substantially the same thermal gradient induced by operation of the power transistor(s) 100. The thermal gradient is depicted in FIG. 6 by arrow 598, indicating the direction of increasing temperature. As also depicted in FIG. 6, the terminals 574, 578 are located at the cooler end of the thermoelectric device 550, so that the voltage of the thermoelectric device 550 can advantageously be detected at the cooler temperature, as described above.

FIG. 6 also depicts that, if the doping concentrations of the p-thermoelectric body 554 and the n-thermoelectric body 558 are the same, the n-thermoelectric body 558 can have a smaller width 559 than the width 555 of the p-thermoelectric body 554 because the mobility of electrons in polysilicon is higher than the mobility of holes. However, it is also possible that the bodies 554, 558 have unequal doping concentrations. Thus, another way to specify the widths 555, 559 is by the square root of the ratio of sheet resistances. For example, if the n-type thermoelectric body 558 has a sheet resistance of 10 ohm-centimeter (ohm-cm), and the p-type thermoelectric body 554 has a sheet resistance of 20 ohm-cm, then the width 555 of the p-type thermoelectric body 554 should be about 1.4 (the square root of 2) times more than the width 559 of the n-type thermoelectric body 558, assuming that (as depicted in the example implementation 550 of FIG. 6) the bodies 554, 558 are equal in length.

Figure 7:
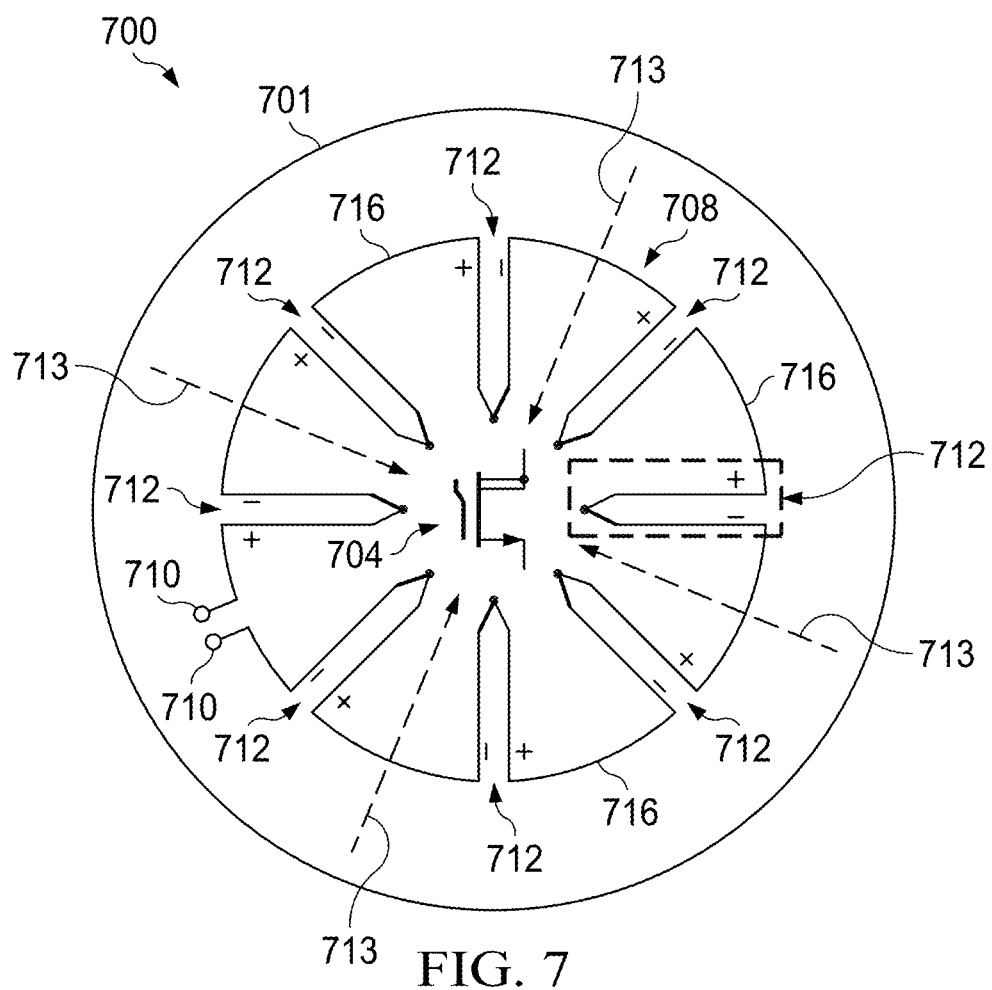
FIG. 7 is a schematic circuit diagram of at least a portion of an example implementation of an IC comprising a power transistor and a thermoelectric device according to one or more aspects of the present disclosure.

FIG. 7 is a schematic circuit diagram of at least a portion of an example implementation of an IC 700 comprising a power transistor 704 and a thermoelectric device 708 utilized to control the operation of the power transistor 704 according to one or more aspects of the present disclosure. The power transistor 704 may be an implementation of the power transistor 100 and/or other power transistors described above, or even an array of such power transistors.

Power transistors often necessitate operation within a high power-dissipation regime, such as high in-rush current power switches and high voltage operational amplifiers and power amplifiers. A thermal safe operation area (SOA) sets a bound on the maximum amount of power that a power transistor can safely dissipate. For example, the thermoelectric device 708 may comprise a plurality of thermocouples 712 each placed normal to a closed contour (e.g., a circle as shown, or a polygon) 701 surrounding the power transistor 704. Each thermocouple 712 may be an implementation of the thermoelectric devices described above and is oriented in a radial direction so as to be approximately thermally parallel relative to thermal gradients within the contour, said gradients being depicted in FIG. 7 by arrows 713 pointing in the direction of increasing temperature. The thermocouples 712 are electrically connected in series by various conductors 716 between terminals 710 of the thermoelectric device 708, such that the sum of the voltages of the thermocouples 712 is sensed as a thermoelectric device 708 voltage ($V_{TE}$) across the terminals 710. The $V_{TE}$ yields an approximation of temperature change (e.g., heat flux) resulting from power dissipation of the power transistor 704. Therefore, the VIE can then be used to estimate such power dissipation as a function of thermal conductance, Seebeck coefficient, and geometry.

Figure 8:
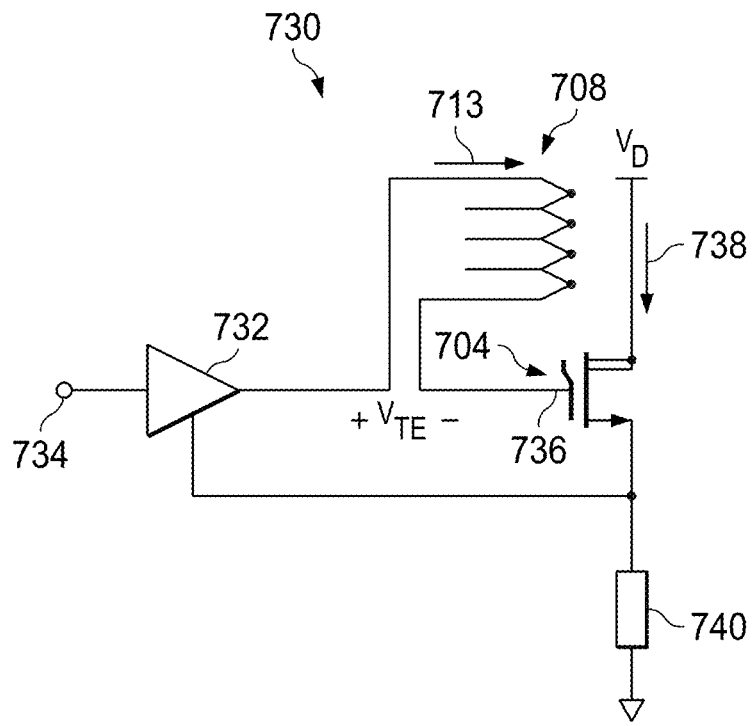
FIG. 8 is a circuit diagram of at least a portion of an example implementation of an IC according to one or more aspects of the present disclosure.
Figure 9:
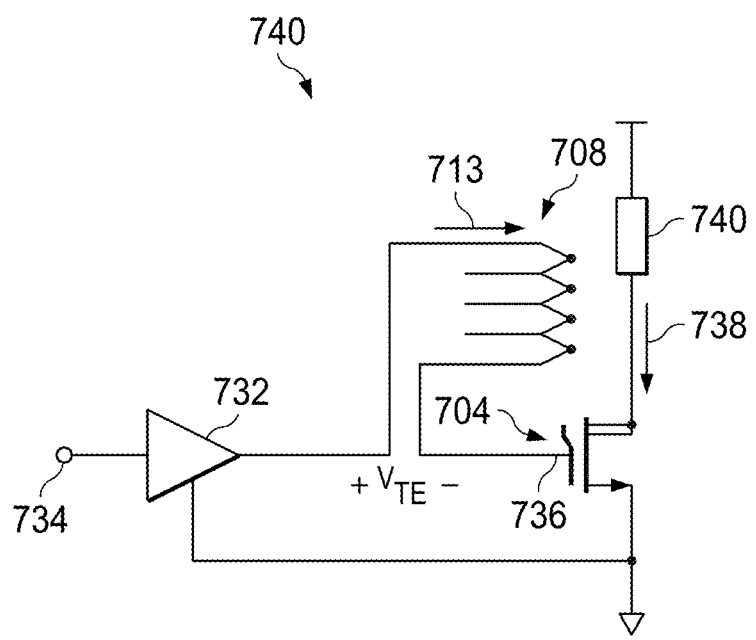
FIG. 9 is a circuit diagram of at least a portion of another example implementation of an IC according to one or more aspects of the present disclosure.

FIG. 8 is a circuit diagram of at least a portion of an example implementation of an IC 730 according to one or more aspects of the present disclosure. FIG. 9 is a circuit diagram of at least a portion of another example implementation of an IC 740 according to one or more aspects of the present disclosure. The ICs 730, 740 present example implementations of the IC 700 shown in FIG. 7. Thus, the following description refers to FIGS. 7-9, collectively.

In FIGS. 8 and 9, a gate driver 732 includes an input 734 for receiving an input signal from a controller such than an output of the gate driver 732 would be connected to the gate 736 of the power transistor 704 to control the power transistor 704. However, the thermoelectric device 708 is connected between the gate driver 732 and the gate 736 of the power transistor 704, such that the $V_{TE}$ produced by the thermoelectric device 708 is used as feedback to regulate the maximum power dissipation of the power transistor 704. For example, as the temperature gradient 713 increases, $V_{TE}$ will increase, thus limiting the power dissipation of the power transistor 704 in a form of negative feedback. FIGS. 8 and 9 also include an arrow 738 indicating the drain current of the power transistor 704. FIGS. 8 and 9 also indicate that the load impedance 740 can either be on the low-side (FIG. 8) or the high-side (FIG. 9) of the power transistor 704.

Figure 10:
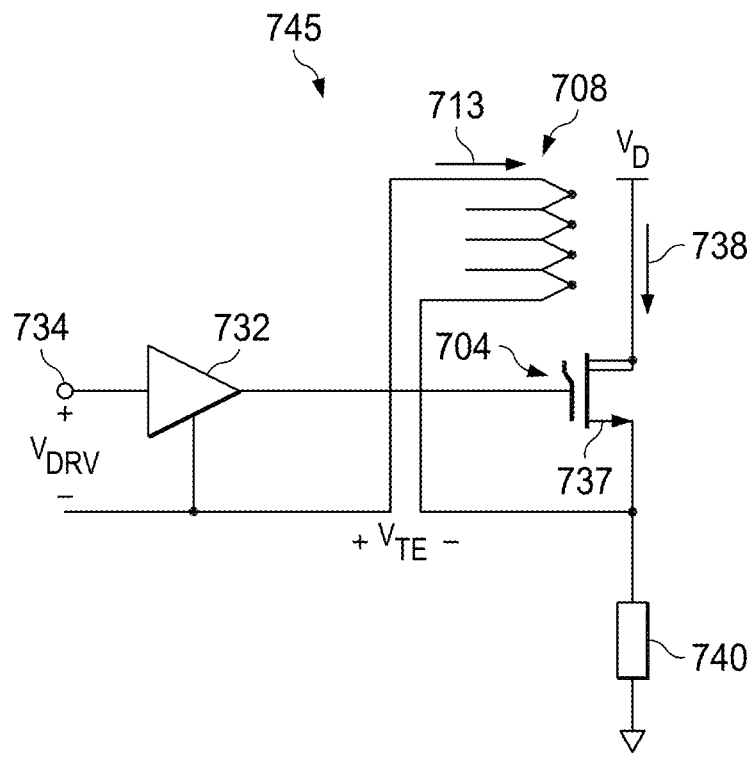
FIG. 10 is a circuit diagram of at least a portion of another example implementation of an IC according to one or more aspects of the present disclosure.

FIG. 10 is a circuit diagram of at least a portion of another example implementation of an IC 745 according to one or more aspects of the present disclosure. The IC 745 is substantially the same as the IC 730 shown in FIG. 8 except that the thermoelectric device 708 is directly coupled to the source 737 of the power transistor 704 instead of the gate 736. The polarity of the thermoelectric device 708 is also reversed relative to the example depicted in FIG. 8.

Figure 11:
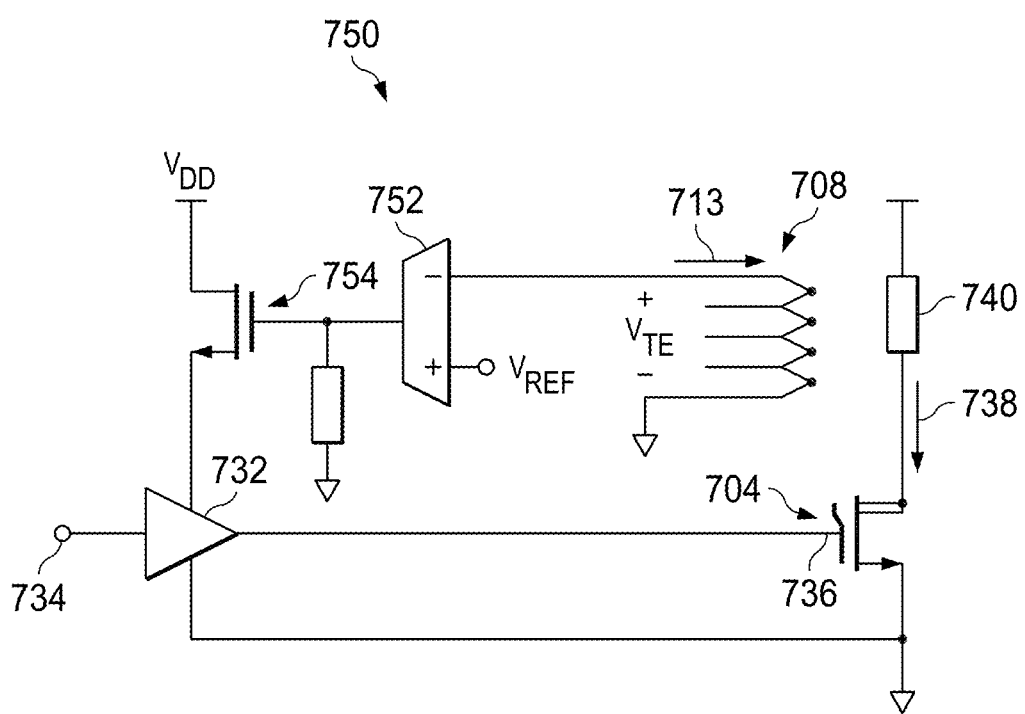
FIG. 11 is a circuit diagram of at least a portion of another example implementation of an IC according to one or more aspects of the present disclosure.

The ICs 730, 740, 745 demonstrate examples of the thermoelectric device 708 limiting the power dissipation of the power transistor 704 by being directly coupled to the gate 736 or source 737 of the power transistor 704. However, the thermoelectric device 708 may also limit power dissipation by being indirectly coupled to the gate 736. For example, as depicted in the example IC 750 shown in FIG. 11, the negative terminal of the thermoelectric device 708 may be connected to ground and the positive terminal of the thermoelectric device 708 may be connected to the negative terminal of an amplifier 752. The amplifier 752 compares the voltage provided by the thermoelectric device 708 to a reference voltage $V_{REF}$ and outputs a signal to the gate of a biasing transistor 754. The resulting biasing signal from the biasing transistor 754 is coupled to the gate driver 732 (e.g., the supply of the gate driver), the output of which is coupled to the gate 736 of the power transistor 704. Thus, the thermoelectric device 708 is indirectly connected to the power transistor 704 while still being used as negative feedback to limit the power dissipation of the power transistor 704.

The ICs 730, 740, 745, 750 each reduce the gate-source voltage $V_{GS}$ and thus the drain current 738 when dissipating excessive power, and thermal SOA limits occur when in saturation (e.g., when mutual conductance $g_m$ is high). Directly coupling the thermoelectric device 708 in series with the gate 736, as in the ICs 730, 740, 745 of FIGS. 8-10, provides a simple utilization of the thermoelectric device 708 as a thermal sensor with minimal overhead. However, the direct coupling may increase gate delay and/or provide inadequate thermal gain feedback. Indirectly coupling the thermoelectric device 708 with the gate 736, as in the IC 750 of FIG. 11, may permit regulating power with high gain feedback and accuracy, although with greater costs, physical circuit area, and other overhead factors.

There are several ways to achieve an intended gain of the feedback loop including the thermoelectric device(s) integrated with the power transistor (or within each section of a transistor array, such as the transistor array sections 850, 854, 858 described below). From a thermoelectric perspective, limiting the gain permits utilizing fewer thermopiles. The intended gain may be achieved by utilizing different doping concentrations for the thermoelectric device(s) of each transistor or transistor array section, thereby "tuning" the Seebeck coefficient for each thermoelectric device. The intended gain may also or instead be achieved by using different numbers of thermocouples stacked in series versus parallel. Another gain factor is the granularity of the transistor array. For example, the granularity may be changed by altering the number of array sections in the array (e.g., while maintaining the same number of thermopiles per transistor). Different granularities may also be designed such that one or more array sections have a different size and/or relative spacing compared to the size and/or relative spacing of one or more other array sections, and/or where the lateral spacing between an array section and each of a first plurality of surrounding array sections is different than the lateral spacing between each array section of that first plurality and each array section of a second plurality of array sections surrounding the first plurality.

Figure 12:
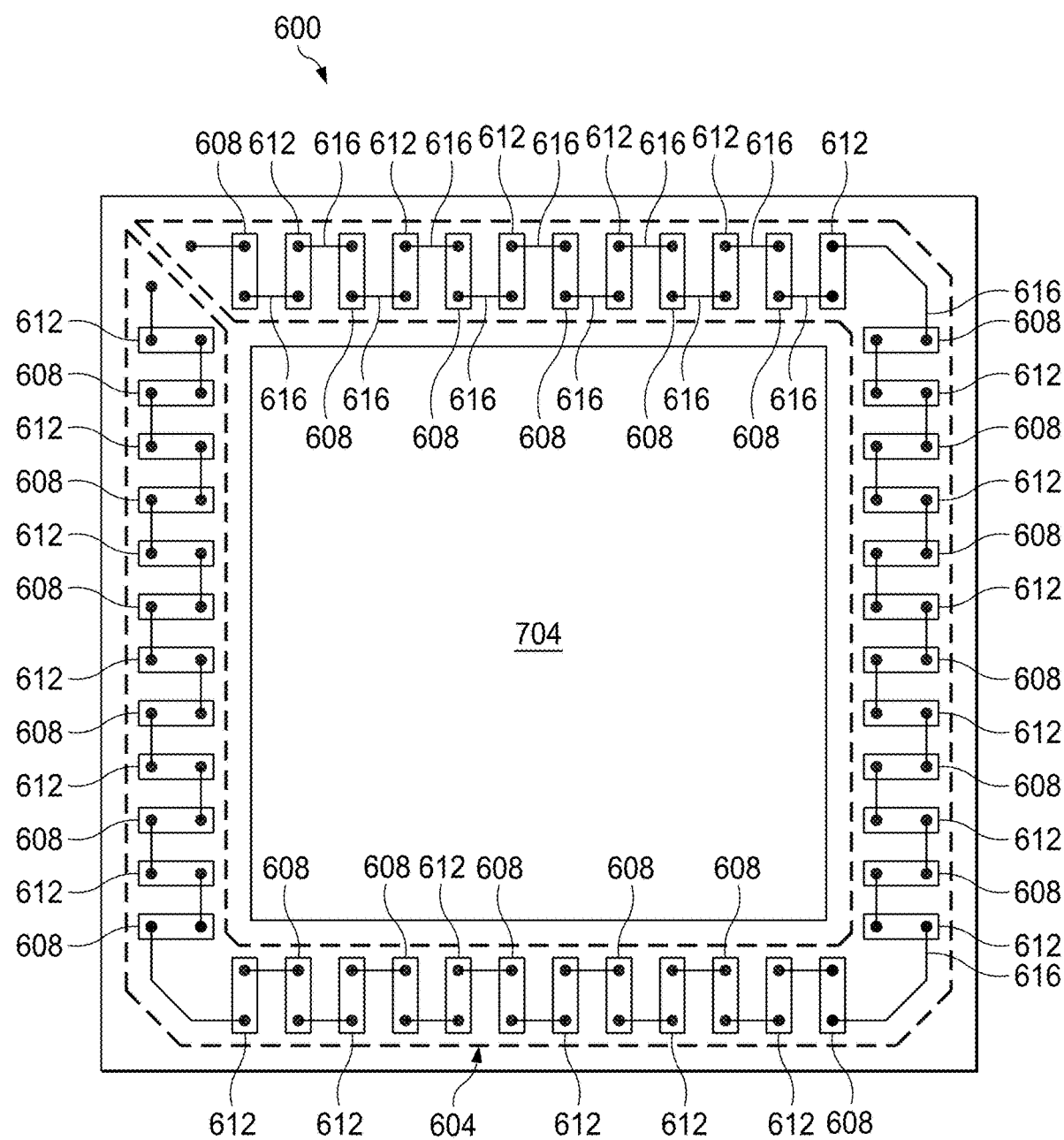
FIG. 12 is a schematic plan view of at least a portion of an example implementation of the IC shown in FIG. 7 according to one or more aspects of the present disclosure.

FIG. 12 is a schematic plan view of at least a portion of an example implementation (designated in FIG. 12 by reference number 600) of the IC 700 shown in FIG. 7, in which the thermoelectric device 708 (designated in FIG. 12 by reference number 604) comprises a plurality of thermopiles that includes alternating p-type (608) and n-type (612) polysilicon members formed on the semiconductor substrate 104, similar to the p-thermoelectric body 554 and n-thermoelectric body 558 shown in FIG. 6. The alternating p-type and n-type polysilicon members 608, 612 are connected in series around the power transistor 704, such as by conductors 616 similar to the conductive features 590 and conductor 594 shown in FIG. 6. The polysilicon members 608, 612 are oriented so that they are all thermally in parallel, so that the serpentine thermoelectric device 604 extending all the way around the power transistor 704 captures all of the lateral heat flow. The n-type members 612 are electrically directed outward (away from the power transistor 704) and the p-type members 608 are electrically directed inward (toward the power transistor 704). By electrically connecting the polysilicon members 608, 612 in the manner shown in FIG. 12, the opposite thermoelectric powers will add in terms of a constructive voltage around the periphery.

The concept depicted in FIG. 12 utilizes aspects of the example thermoelectric device 550 shown in FIG. 6. However, the same concept may be achieved using the other thermoelectric devices described herein and/or otherwise within the scope of the present disclosure to achieve other thermoelectric devices extending around the edge of the power transistor 704.

Figure 13:
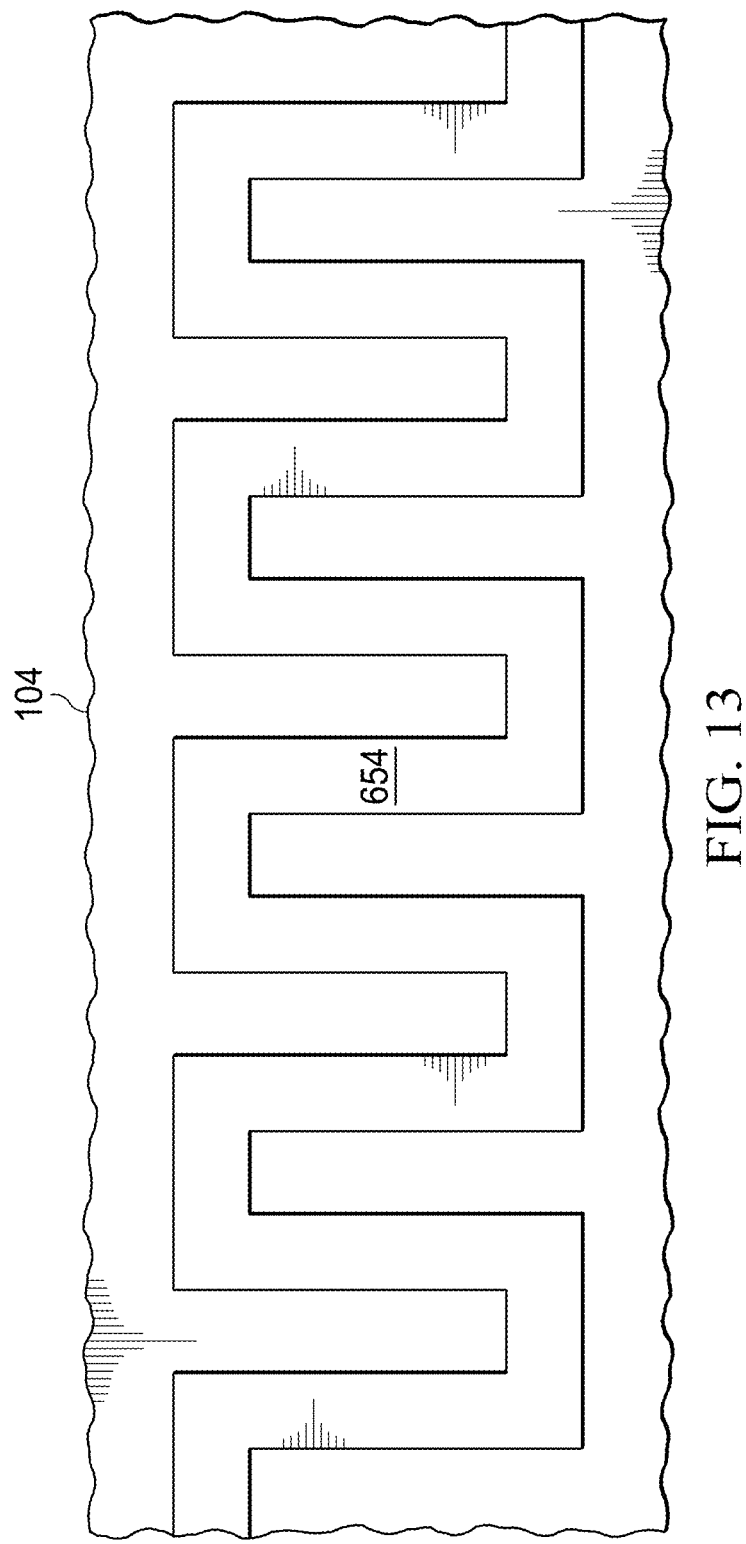
FIGS. 13-16 are plan views depicting the manufacture of an example implementation of a thermoelectric device according to one or more aspects of the present disclosure.
Figure 14:
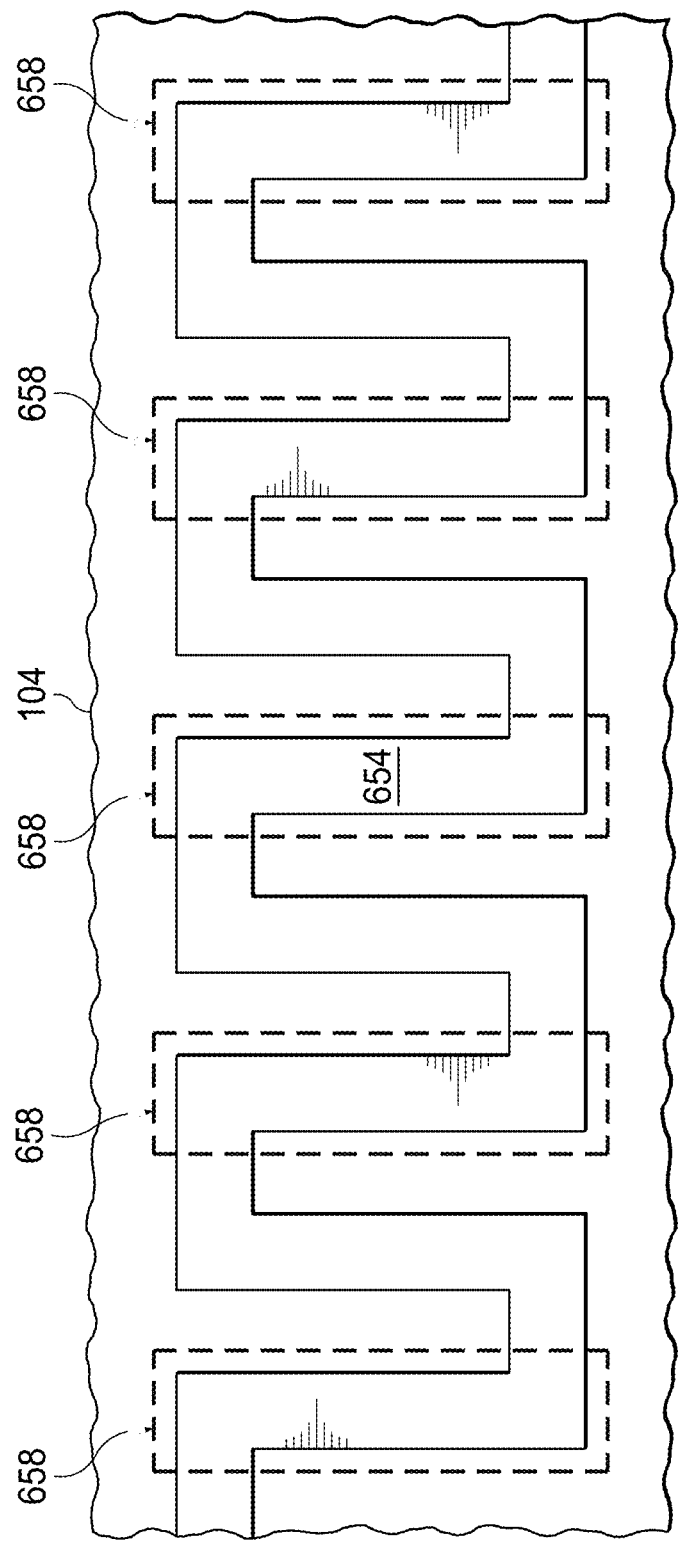
Figure 15:
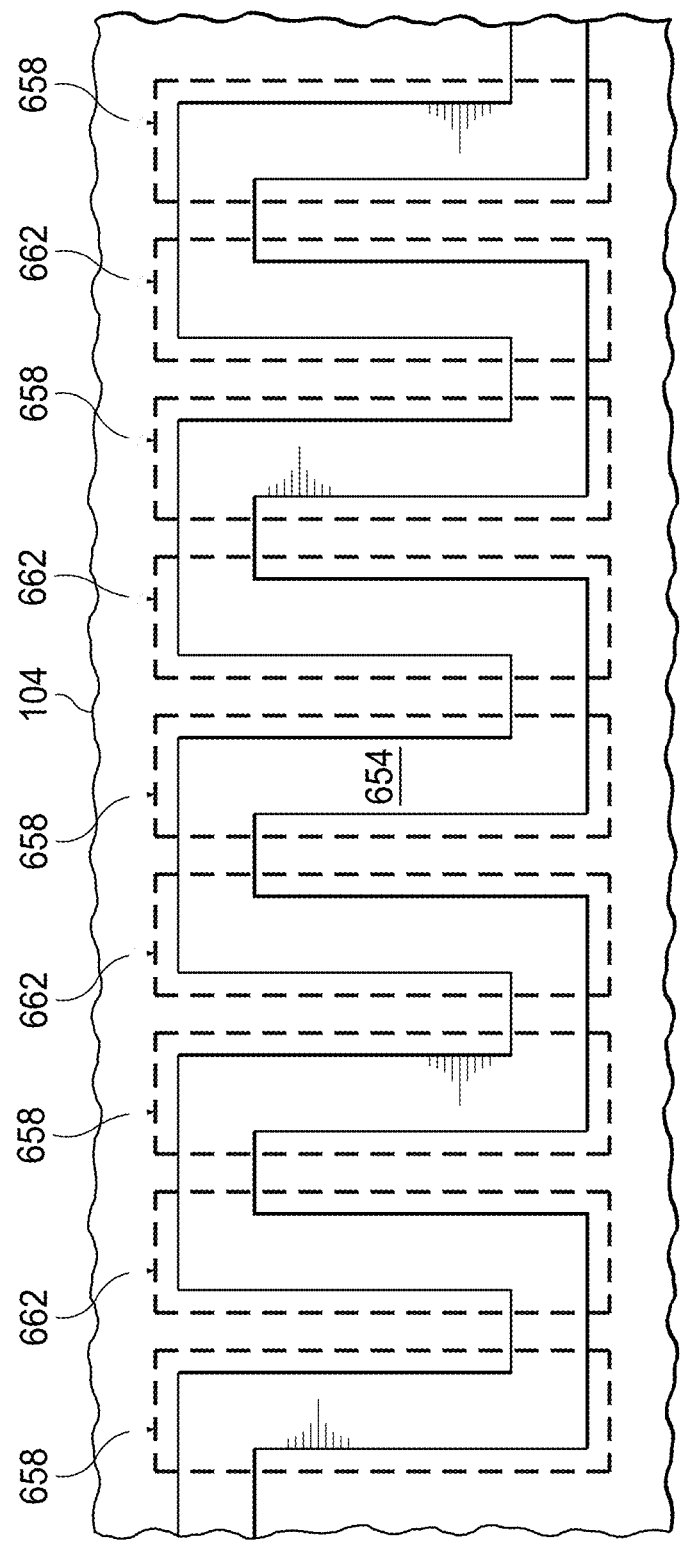
Figure 16:
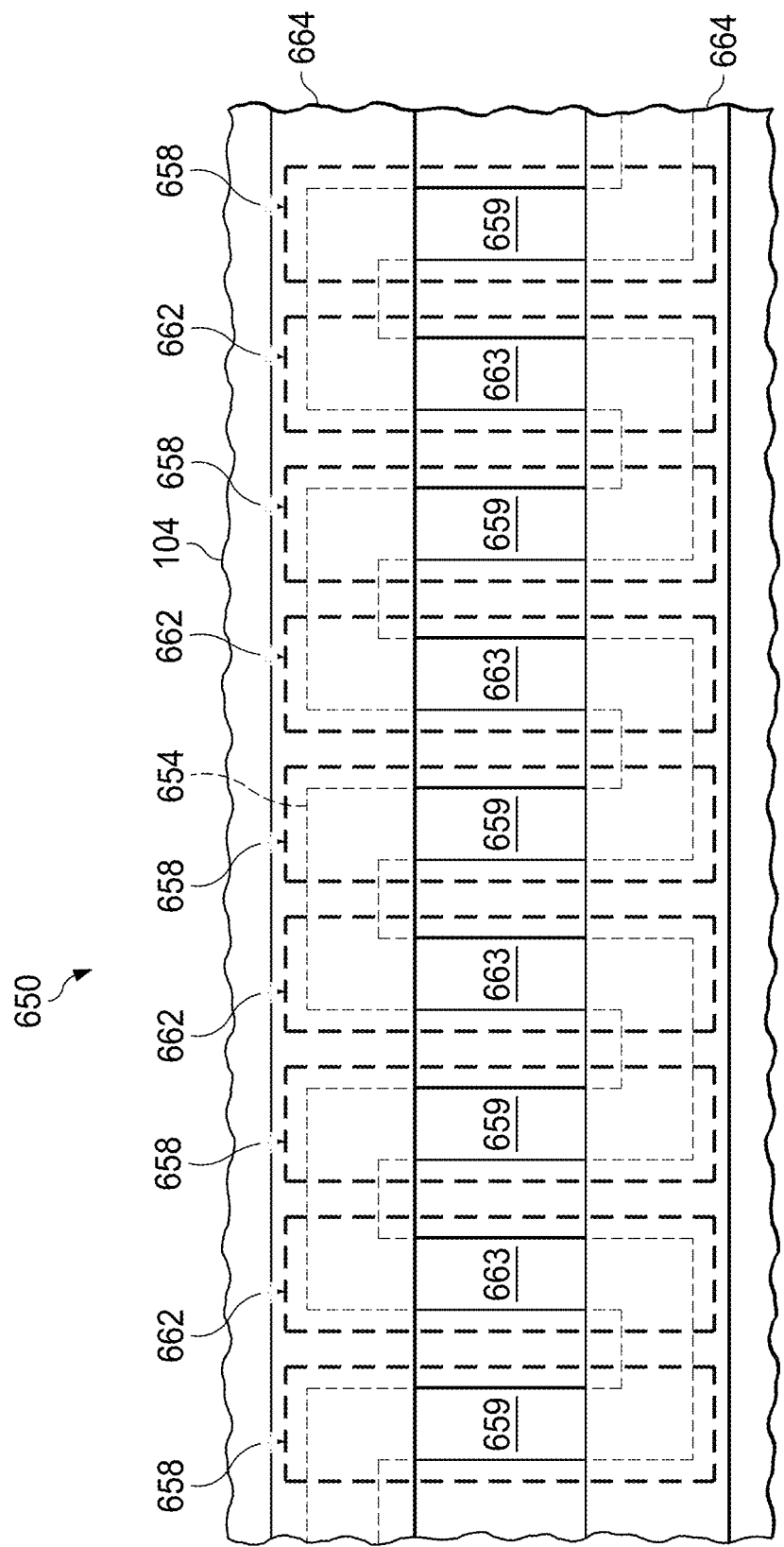

For example, a portion of one such additional implementation 650 is depicted in FIG. 16, in which the plurality of individual polysilicon members 608, 612 shown in FIG. 12 are replaced by alternating p-type and n-type doped portions of one polysilicon member (or perhaps a few polysilicon members). FIGS. 13-15 depict example manufacturing steps leading to the example implementation shown in FIG. 16.

In FIG. 13, a polysilicon member 654 has been formed on the semiconductor substrate 104 in serpentine pattern extending around the power transistor 704 (not shown). FIG. 14 depicts that portions 658 of the polysilicon member 654 undergo p-type doping, such as via masked implants. FIG. 15 depicts that other portions 662 of the polysilicon member 654 undergo n-type doping by, for example, additional masked implants. Each n-doped portion 662 interposes two neighboring p-doped portions 658, thus forming alternating n-doped and p-doped portions 658, 662 electrically connected in series by the undoped portions of the polysilicon member 654. FIG. 16 depicts two sections of a silicide block oxide (e.g., oxide with an inverse-masked etch) 664 to delineate p-type thermopiles 659 and n-type thermopiles 663.

The above-described thermoelectric devices may be utilized in an array of power transistors separated into sections (e.g., banks) that each comprise one or more of the above-described power transistors. The transistor banks may be isolated by instances of the isolation structure 110 described above. Each transistor bank may include a thermoelectric device, such as the thermoelectric device 604 depicted in FIG. 12, the thermoelectric device 650 depicted in FIG. 16, and/or other thermoelectric devices within the scope of the present disclosure. The thermoelectric device within each transistor array section produces an electrical signal (e.g., a voltage) indicative of a temperature change and/or power dissipation of the one or more power transistors of that array section.

In some baseline transistor arrays, the power transistors are independently operated and thus subject to thermal runaway, known as the Spirito effect. That is, the power transistors each generate heat as they dissipate more power. A transistor surrounded by other transistors becomes hotter than the surrounding transistors, such that the threshold voltage of the surrounded transistor decreases relative to the threshold voltages of the surrounding transistors, which then causes the surrounded transistor to conduct more current. The increased current causes more power dissipation by the surrounded transistor, which further increases its temperature, which further decreases its threshold voltage, which further increases its drain current, etc. If this thermal loop experiences a gain greater than one (1), these factors reach an unstable condition and the surrounded transistor may thermally run away, drawing more and more current until it self-destructs. This is especially a risk in high-voltage applications because the higher voltage leads to higher gain values.

Figure 17:
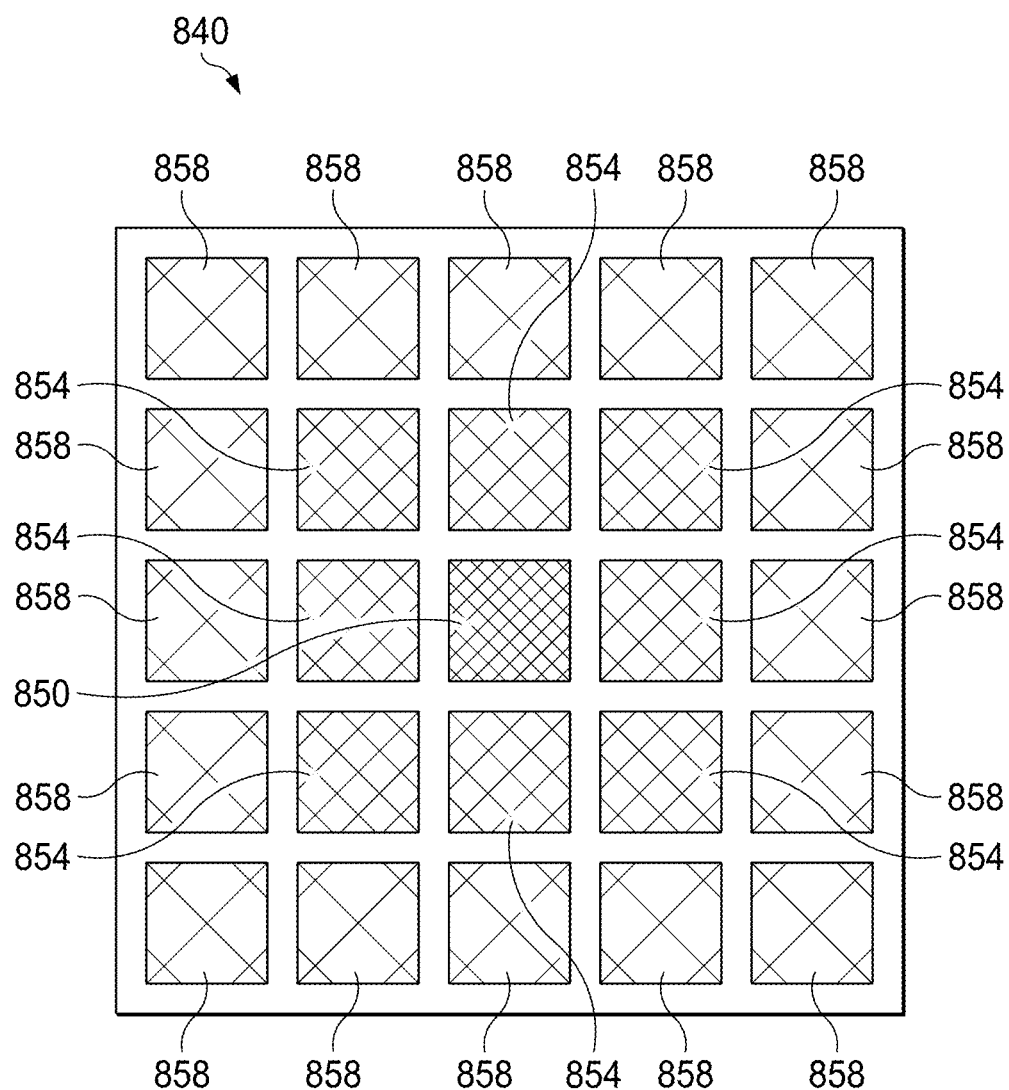
FIG. 17 is a heat map of an example power transistor array.

For example, FIG. 17 is a heat map of a power transistor array 840 arranged in five rows and five columns of transistor array sections 850, 854, 858, each section comprising one or more of the above-described power transistors and one or more of the above-described thermoelectric devices configured to produce an electric signal (e.g., a voltage) indicative of the temperature (or heat flux) of that section. For the sake of clarity and ease of understanding, the power transistors and thermoelectric devices are not shown in FIG. 17. Instead, FIG. 17 depicts a centrally positioned section 850, an intermediate ring of sections 854 surrounding the central section 850, and an outer ring of sections 858 surrounding the intermediate sections 854. The temperature of the sections 850, 854, 858 is indicated in FIG. 17 by the density of cross-hatching within each section. Because the power dissipation of the sections 850, 854, 858 were initially the same, the intermediate sections 854 are hotter than the outer sections 858, and the central section 850 is hotter than all other sections 854, 858.

Figure 18:
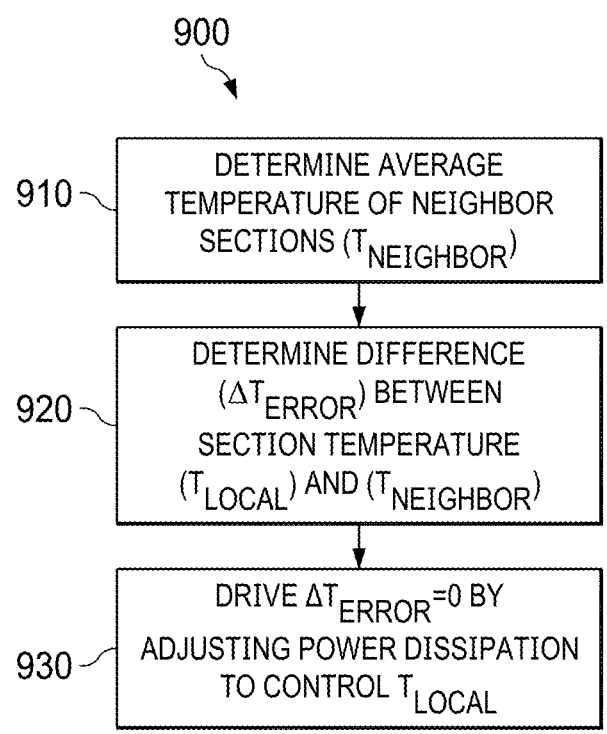
FIG. 18 is a flow-chart diagram of at least a portion of an example implementation of a method according to one or more aspects of the present disclosure.

FIG. 18 is a flow-chart diagram of at least a portion of an example implementation of a method 900 for regulating the temperature of a power transistor array according to one or more aspects of the present disclosure. The method 900 illustrates the concept of the gain design for the thermoelectric devices of each array section 850, 854, 858. Accordingly, the following description refers to FIGS. 17 and 18, collectively.

The method 900 includes determining 910 the average temperature of all neighboring sections. For example, with respect to the central section 850, the average temperature ($<T_{NEIGHBOR}>$) is the average temperature of the intermediate sections 854. A difference ($\Delta T_{ERROR}$) between $<T_{NEIGHBOR}>$ and the temperature of the central section 850 ($T_{LOCAL}$) is then determined 920. In the limit that the gain of the thermoelectric device of the central section 850 is high enough, $T_{LOCAL}$ is controlled such that $\Delta T_{ERROR}$ is driven 930 to zero (0). This is performed for each section 850, 854, 858 such that the power dissipation of the one or more power transistors of that section is adjusted to equalize the temperature ($T_{LOCAL}$) of that section with the average temperature of all adjacent sections (($T_{NEIGHBOR}>$). Consequently, when $\Delta T_{ERROR}$ is driven to zero, $T_{LOCAL}=<T_{NEIGHBOR}>$. Therefore, the minimum temperature of the adjacent sections will be less than or equal to the temperature of the adjusted section, which will be less than the maximum temperature of the adjacent sections, or min $\{T_{NEIGHBOR}\} \leq T_{LOCAL} \leq$ max $\{T_{NEIGHBOR}\}$. Accordingly, temperature extrema can only occur at the boundaries of the transistor array, such as the outer sections 858. A symmetric boundary (e.g., a circle) may thus aid in ensuring uniform temperature distribution.

In other words, if each transistor in the array 840 has a given temperature, and the gain of the thermoelectric device of each array section adjusts that temperature locally, such that the difference between that local temperature and the average temperature of the neighboring array sections is driven zero (0), then the boundary temperature is set, thereby enforcing that the entire temperature array is going to be uniform. That is, if the temperatures of the array sections around any one array section are equal to the "local" temperature of that one array section, then the local temperature is necessarily bounded between the minimum and maximum temperatures of the neighboring array sections. Thus, while integrated thermoelectric devices as described above and in the related disclosures cross-referenced above may be utilized to assess array-level thermal gradients by orienting unit thermocouples relative to an assumed symmetry of the heat field of the array so as to estimate a hotspot temperature within the entire array, the present disclosure also introduces orienting integrated thermoelectric devices within each array section 850, 854, 858 so as to assess the heat flow out of each array section 850, 854, 858.

Figure 19:
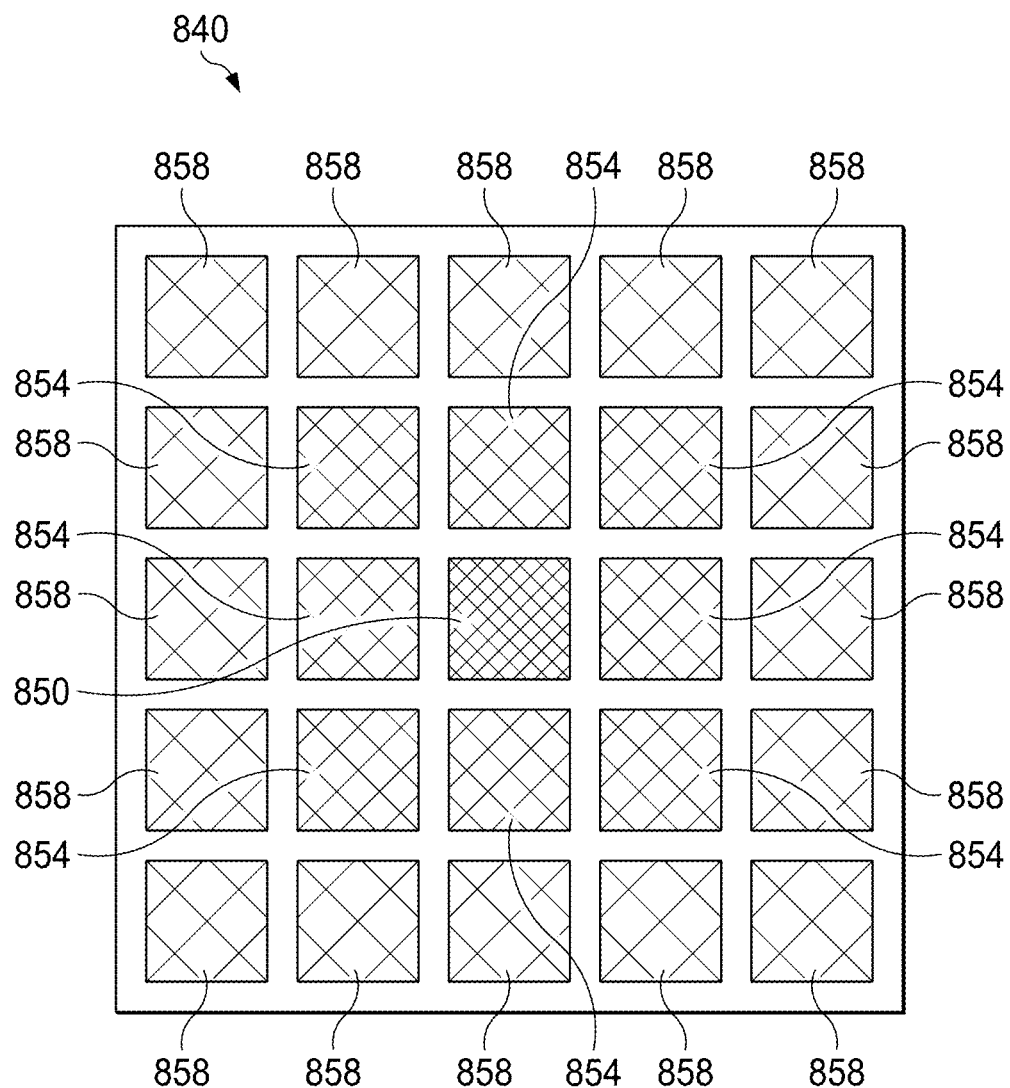
FIG. 19 is a heat map of the power transistor array shown in FIG. 17 utilizing a net gain value of approximately zero according to one or more aspects of the present disclosure.

For example, FIG. 19 is a heat map of the power transistor array 840 shown in FIG. 17 when the method 900 is applied with a net gain (Spirito gain minus active feedback gain from circuits 730, 740, 745, or 750 described above) value of approximately zero. As a result, the central section 850 is cooler than in FIG. 17, whereas the outer sections 858 are warmer than in FIG. 17. The power is equally distributed, and the hotspots are weaker in that the differences between the hottest section temperature and the temperature of the adjacent sections are smaller than in FIG. 17. Such implementations remove the thermal runaway boundary limit and extend the thermal SOA.

Figure 20:
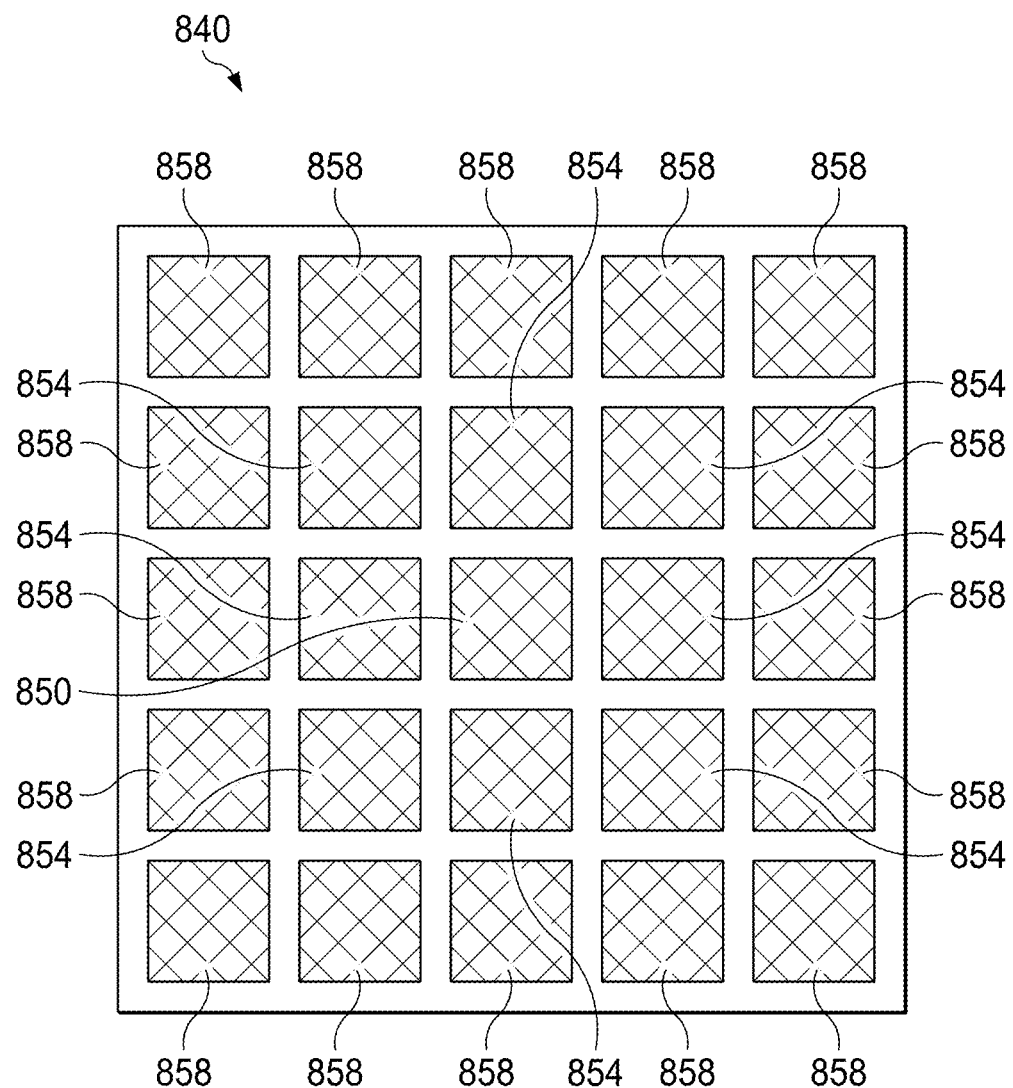
FIG. 20 is a heat map of the power transistor array shown in FIG. 17 utilizing a net gain value much less than −1 according to one or more aspects of the present disclosure.

FIG. 20 is a heat map of the power transistor array 840 when the method 900 is applied with a net gain value much less than −1. As a result, each section 850, 854, 858 is at approximately the same temperature, and there are no discernable hotspots. Such implementations improve the maximum power boundary and further extend the thermal SOA.

Figure 21:
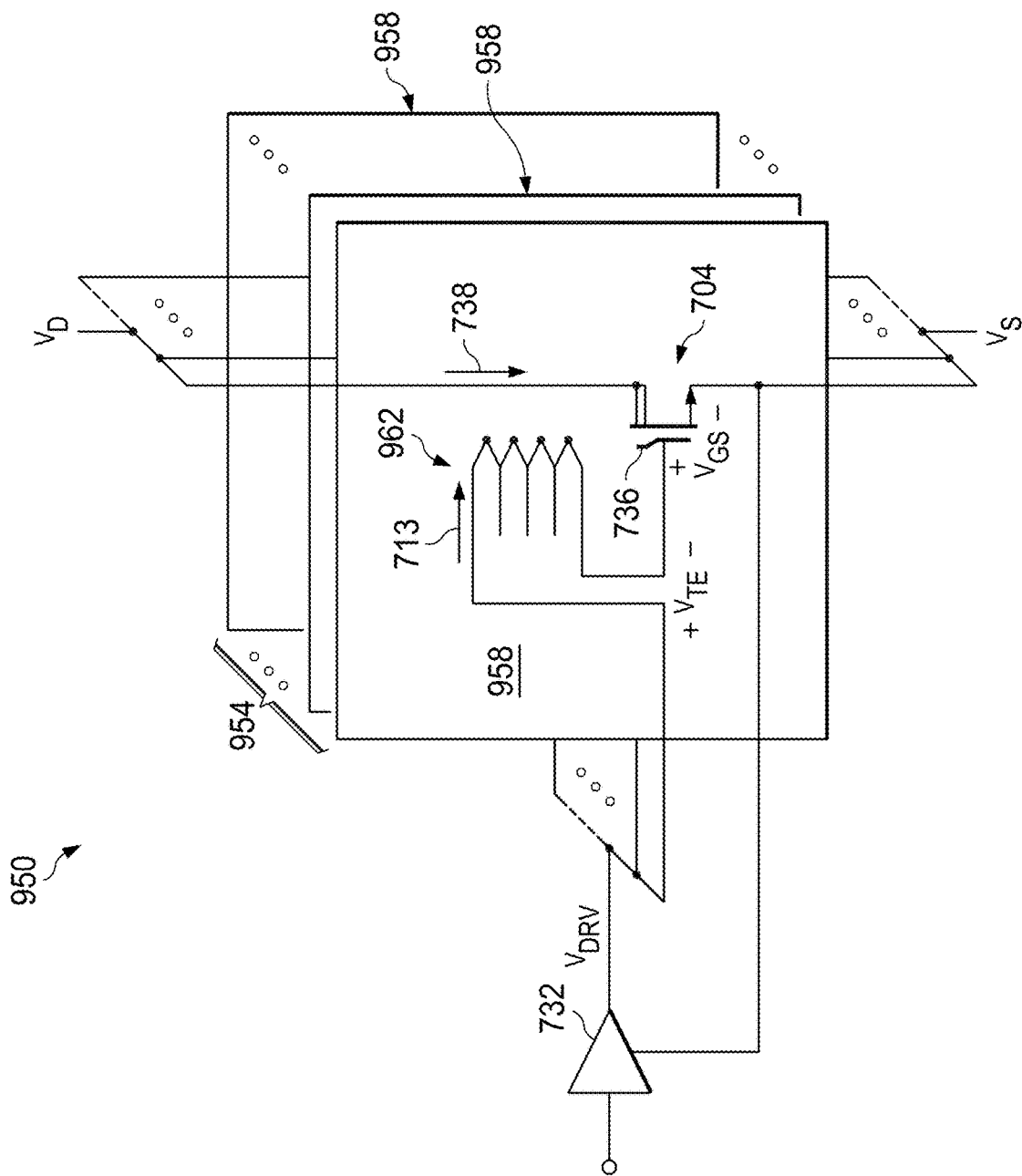
FIG. 21 is a schematic circuit diagram of a portion of an example implementation of a power transistor IC apparatus according to one or more aspects of the present disclosure.

FIG. 21 is a schematic circuit diagram of a portion of an example implementation of a power transistor IC apparatus 950 provided herein as an example implementation enabling the concept described above with respect to FIGS. 17-20. The apparatus 950 includes an array 954 of power transistors 704 separated into a plurality of transistor banks 958 that each comprise one or more of the above-described power transistors. Each transistor bank 958 includes a thermoelectric device 962, such as the thermoelectric device 600 depicted in FIG. 12, the thermoelectric device 650 depicted in FIG. 16, and/or other thermoelectric devices within the scope of the present disclosure. The thermoelectric device 962 within each transistor bank 958 produces a voltage $V_{TE}$ indicative of the temperature or heat flux 713 and/or power dissipation of the one or more power transistors 704 of that transistor bank 958. The apparatus 950 also includes a gate driver 732 providing a drive voltage $V_{DRV}$ to each transistor bank 958. The drive voltage $V_{DRV}$ provided to each transistor bank 958 drives the gate(s) 736 of the transistor(s) 704 of that transistor bank 958, subject to the limiting effect of the voltage $V_{TE}$ provided by the thermoelectric device 962 within that transistor bank 958, resulting in the drain current 738 and a gate-source voltage $V_{GS}$.

Figure 22:
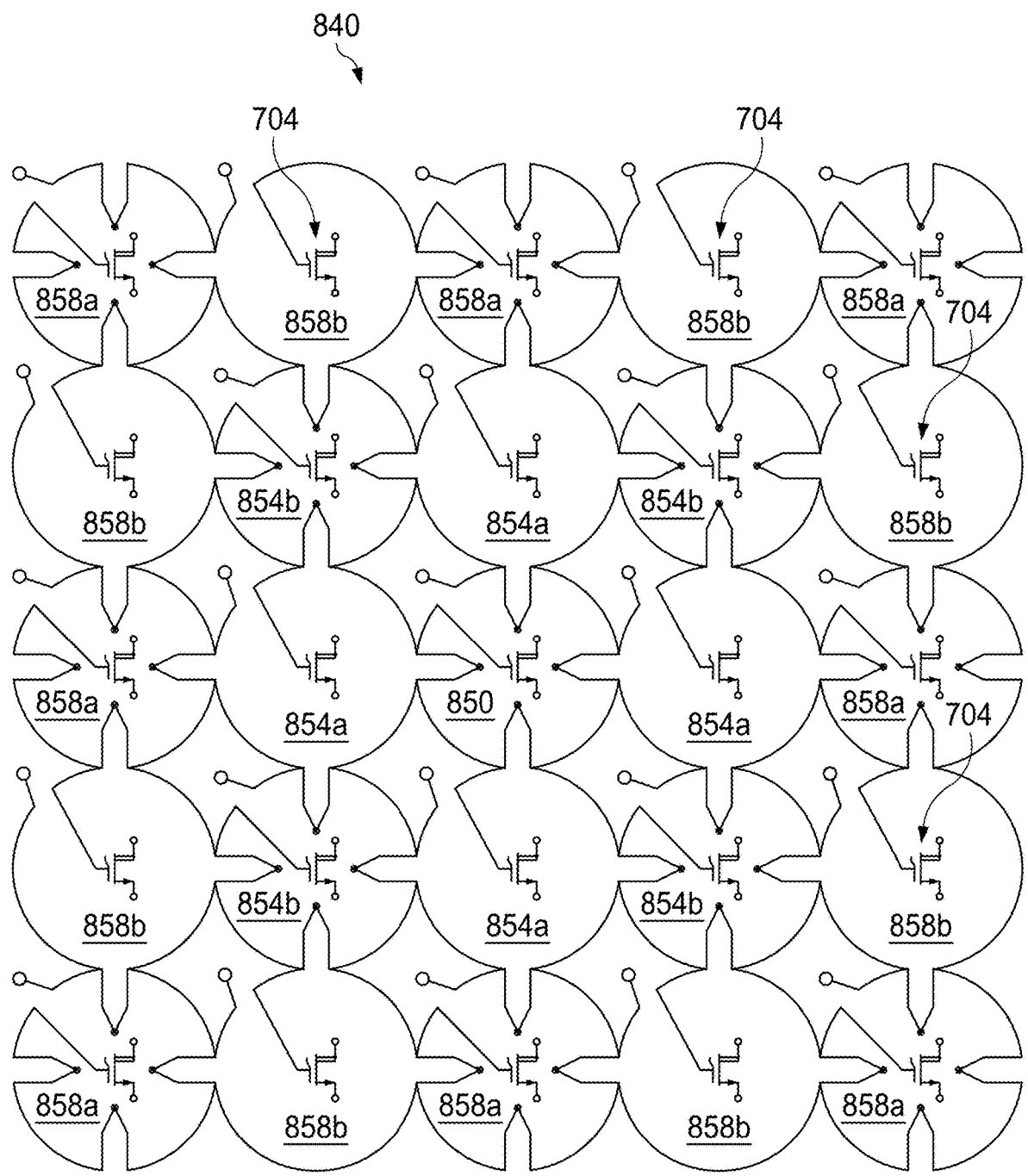
FIG. 22 depicts another example implementation of the transistor array depicted in FIG. 20 according to one or more aspects of the present disclosure.

FIG. 22 depicts another example implementation of the transistor array 840 depicted in FIG. 20 demonstrating that the thermoelectric circuits of some of the array sections 850, 854, 858 may share thermoelectric devices with neighboring ones of the array sections 850, 854, 858. For example, the intermediate ring of array sections 854 includes array sections 854a located at cardinal directions (N, S, E, W) with respect to the center array section 850, while the remaining intermediate array sections 854b are located at ordinal directions (NE, SE, SW, NW) with respect to the center array section 850. Similarly, the outer ring of array sections 858 includes alternating array sections 858a, 858b, where each outer array section 858a is located at cardinal or ordinal directions with respect to the center array section 850 and the remaining outer array sections 858b are each located at cardinal directions with respect to a neighboring intermediate array section 854b. Each thermocouple of the thermoelectric circuit of the center section 850 is connected in the thermoelectric circuit of a corresponding intermediate array section 854a neighboring the center array section 520. Similarly, the thermocouples of the thermoelectric circuit of each intermediate array section 854b are each connected to the thermoelectric circuit of a corresponding one of the neighboring intermediate and outer array sections 854a, 858b, and each outer array section 858a similarly shares two or three thermocouples with the neighboring intermediate and outer array sections 854a, 858b. Thus, about half of the array sections do not include integrated thermoelectric devices, but instead only include electrical connections to the thermoelectric devices integrated in the neighboring array sections, thereby reducing the total number of thermoelectric devices in the array by about half.

This principle may be applied, e.g., to a configuration of the thermoelectric device 604 shown in FIG. 12. For example, some or all of the polysilicon members 608, 612 on each side of the power transistor 704 in FIG. 12 may be shared between thermoelectric circuits used to monitor the heat flux relative to the power transistor 704 and a nearest-neighbor power transistor.

To achieve the correct polarity of $V_{TE}$ at each transistor 704, the thermocouples of the center array section 850, the intermediate array sections 854*b*, and the outer array sections 858*a* are (within the thermoelectric circuit of each individual section) connected in series clockwise, whereas those same thermocouples are connected in series counter-clockwise for the remaining array sections 854*a*, 858*b*. In FIG. 22, about half of the array sections have four thermocouples, but this is for conceptual depiction purposes—each array section having thermocouples may have any number of thermocouples, each of which may be according to one or more of the example thermocouples described above, described in the related disclosures cross-referenced above, and/or otherwise within the scope of the present disclosure.

In view of the entirety of the present disclosure, including the claims and the figures, a person having ordinary skill in the art will readily recognize that the present disclosure introduces an integrated circuit comprising: an electronic device formed in and/or over a semiconductor substrate; and a thermoelectric circuit including a plurality of thermopiles formed in and/or over the semiconductor substrate and electrically connected in series, wherein the thermoelectric circuit is configured to modulate operation of the electronic device in response to a potential produced by the plurality of thermopiles.

The thermoelectric circuit may surround the electronic device.

The electronic device may be a power transistor. The thermoelectric circuit may be electrically connected between a gate driver and a gate of the power transistor. The thermoelectric circuit and the gate driver may be connected in a feedback loop to control a voltage at the gate of the power transistor. The feedback loop may include an operational amplifier configured to control an output voltage of the gate driver. The feedback loop may be a negative feedback loop. The integrated circuit may further comprise a comparator that controls a bias voltage supplied to the operational amplifier based on the potential provided by the thermoelectric circuit.

The plurality of thermopiles may comprise alternating p-type and n-type polysilicon members formed on the semiconductor substrate and connected in series around the electronic device.

The plurality of thermopiles may comprise alternating p-type and n-type doped portions of a polysilicon member formed on the semiconductor substrate in serpentine pattern extending around the electronic device.

The electronic device may be one of a plurality of electronic devices each formed in and/or over the semiconductor substrate, the thermoelectric circuit may be one of a plurality of thermoelectric circuits each surrounding a corresponding one of the electronic devices, and each thermoelectric circuit may be configured to reduce a voltage to a control terminal of the electronic device surrounded by that thermoelectric circuit in response to heating of that electronic device caused by operation of that electronic device and neighboring ones of the other electronic devices. The plurality of thermoelectric circuits may comprise a plurality of first thermoelectric circuits and a plurality of second thermoelectric circuits, the first thermoelectric circuits may each include an instance of the plurality of thermopiles connected in series around the corresponding electronic device, and the second thermoelectric circuits may each include one of the thermopiles of each first thermoelectric circuit neighboring that second thermoelectric circuit.

The present disclosure also introduces an integrated circuit comprising: an array of transistors formed in or over a semiconductor substrate, including a first transistor and a second transistor; a first thermoelectric circuit configured to modulate operation of the first transistor in response to a temperature gradient between the first transistor and the second transistor; and a second thermoelectric circuit configured to modulate operation of the second transistor in response to the temperature gradient.

The first thermoelectric circuit may include a first plurality of thermopiles connected in series and surrounding the first transistor, the second thermoelectric circuit may include a second plurality of thermopiles connected in series and surrounding the second transistor, and a subset of the thermopiles may be connected in the first thermoelectric circuit and the second thermoelectric circuit.

The present disclosure also introduces a method of manufacturing an integrated circuit, the method comprising: forming an electronic device in and/or over a semiconductor substrate; forming a thermoelectric circuit, including forming a plurality of series-connected thermopiles in and/or over the semiconductor substrate; and electrically connecting a control terminal of the electronic device and the thermoelectric circuit such that the electronic device is configured to operate dependent on a voltage produced by the electronic device.

The thermopiles and the electronic device may include concurrently-formed material layers.

The electronic device may be a power transistor and the thermoelectric circuit may surround the power transistor.

Forming the thermopiles may comprise: forming alternating p-type and n-type polysilicon members on the semiconductor substrate around the electronic device; and forming additional electrical connections serially connecting polysilicon members.

Forming the thermopiles may comprise: forming a polysilicon member on the semiconductor substrate in serpentine pattern extending around the electronic device; and oppositely doping alternating portions of the polysilicon member.

Forming the electronic device may comprise forming a plurality of electronic devices in and/or over the semiconductor substrate. Forming the thermoelectric circuit may comprise forming a plurality of thermoelectric circuits each surrounding a corresponding one of the electronic devices. Forming the electrical connection may comprise forming a plurality of electrical connections each connecting a control terminal of a corresponding one of the electronic devices and the thermoelectric circuit surrounding that electronic device such that a drive voltage at that control terminal is reduced by a voltage of that thermoelectric circuit resulting from heating of that electronic device and neighboring ones of the other electronic devices. Forming the plurality of thermoelectric circuits may comprise: forming a plurality of first thermoelectric circuits, wherein forming each first thermoelectric circuit comprises forming an instance of the plurality of series-connected thermopiles around the corresponding electronic device; and forming a plurality of second thermoelectric circuits, wherein forming each second thermoelectric circuit comprises forming electrical connections between one of the thermopiles of each first thermoelectric circuit neighboring that second thermoelectric circuit.

The Abstract at the end of this disclosure is provided to comply with 37 C.F.R. § 1.72(b) to permit the reader to quickly ascertain the nature of the technical disclosure. It is submitted with the understanding that it will not be used to interpret or limit the scope or meaning of the claims.

What is claimed is:

1. An integrated circuit, comprising:
an electronic device formed in and/or over a semiconductor substrate; and
a thermoelectric circuit including a plurality of thermopiles formed in and/or over the semiconductor substrate and electrically connected in series, wherein:
the thermoelectric circuit is configured to modulate operation of the electronic device in response to a potential produced by the plurality of thermopiles; and
the thermoelectric circuit is electrically connected between a gate driver and a control terminal of the electronic device.

2. The integrated circuit of claim 1 wherein the thermoelectric circuit surrounds the electronic device.

3. The integrated circuit of claim 1 wherein the electronic device is a power transistor.

4. The integrated circuit of claim 3 wherein the thermoelectric circuit and the gate driver are connected in a feedback loop to control a voltage at the control terminal of the power transistor.

5. The integrated circuit of claim 4 wherein the feedback loop includes an operational amplifier configured to control an output voltage of the gate driver.

6. The integrated circuit of claim 5 wherein the feedback loop is a negative feedback loop.

7. The integrated circuit of claim 5 further comprising a comparator that controls a bias voltage supplied to the operational amplifier based on the potential provided by the thermoelectric circuit.

8. The integrated circuit of claim 1 wherein the plurality of thermopiles comprises alternating p-type and n-type polysilicon members formed on the semiconductor substrate and connected in series around the electronic device.

9. The integrated circuit of claim 1 wherein the plurality of thermopiles comprises alternating p-type and n-type doped portions of a polysilicon member formed on the semiconductor substrate in serpentine pattern extending around the electronic device.

10. The integrated circuit of claim 1 wherein:
the electronic device is one of a plurality of electronic devices each formed in and/or over the semiconductor substrate;
the thermoelectric circuit is one of a plurality of thermoelectric circuits each surrounding a corresponding one of the electronic devices; and
each thermoelectric circuit is configured to reduce a voltage to a control terminal of the electronic device surrounded by that thermoelectric circuit in response to heating of that electronic device caused by operation of that electronic device and neighboring other ones of the electronic devices.

11. The integrated circuit of claim 10 wherein:
the plurality of thermoelectric circuits comprises a plurality of first thermoelectric circuits and a plurality of second thermoelectric circuits;
the first thermoelectric circuits each include an instance of the plurality of thermopiles connected in series around a corresponding one of the electronic devices; and
the second thermoelectric circuits each include one of the thermopiles of each first thermoelectric circuit neighboring that second thermoelectric circuit.

12. An integrated circuit, comprising:
an array of transistors formed in or over a semiconductor substrate, including a first transistor and a second transistor;
a first thermoelectric circuit including a plurality of thermopiles connected in series surrounding the first transistor and configured to modulate operation of the first transistor in response to a temperature gradient between the first transistor and the second transistor; and
a second thermoelectric circuit configured to modulate operation of the second transistor in response to the temperature gradient.

13. The integrated circuit of claim 12 wherein the plurality of thermopiles is a first plurality of thermopiles,
the second thermoelectric circuit includes a second plurality of thermopiles connected in series and surrounding the second transistor, and
a subset of the thermopiles are connected in the first thermoelectric circuit and the second thermoelectric circuit.

14. A method of manufacturing an integrated circuit, the method comprising:
forming an electronic device in and/or over a semiconductor substrate;
forming a thermoelectric circuit, including forming a plurality of series-connected thermopiles in and/or over the semiconductor substrate, wherein the thermoelectric circuit surrounds the electronic device; and
electrically connecting a control terminal of the electronic device and the thermoelectric circuit such that the electronic device is configured to operate dependent on a voltage produced by the thermoelectric circuit.

15. The method of claim 14 wherein the thermopiles and the electronic device include concurrently-formed material layers.

16. The method of claim 14 wherein the electronic device is a power transistor.

17. The method of claim 14 wherein forming the thermopiles comprises:
forming alternating p-type and n-type polysilicon members on the semiconductor substrate around the electronic device; and
forming additional electrical connections serially connecting polysilicon members.

18. The method of claim 14 wherein forming the thermopiles comprises:
forming a polysilicon member on the semiconductor substrate in serpentine pattern extending around the electronic device; and
oppositely doping alternating portions of the polysilicon member.

19. The method of claim 14 wherein:
forming the electronic device comprises forming a plurality of electronic devices in and/or over the semiconductor substrate;
forming the thermoelectric circuit comprises forming a plurality of thermoelectric circuits each surrounding a corresponding one of the electronic devices;
the electrically connecting includes forming a plurality of electrical connections each connecting a control terminal of a corresponding one of the electronic devices and the thermoelectric circuit surrounding that electronic device such that a drive voltage at that control terminal is reduced by a voltage of that thermoelectric circuit resulting from heating of that electronic device and neighboring other ones of the electronic devices; and forming the plurality of thermoelectric circuits comprises:
    forming a plurality of first thermoelectric circuits, wherein forming each first thermoelectric circuit comprises forming an instance of the plurality of series-connected thermopiles around the corresponding one of the electronic devices; and
    forming a plurality of second thermoelectric circuits, wherein forming each second thermoelectric circuit comprises forming electrical connections between one of the thermopiles of each first thermoelectric circuit neighboring that second thermoelectric circuit.

20. An integrated circuit, comprising:
an electronic device formed in and/or over a semiconductor substrate; and
a thermoelectric circuit including a plurality of thermopiles formed in and/or over the semiconductor substrate and electrically connected in series, wherein the thermoelectric circuit is configured to modulate operation of the electronic device in response to a potential produced by the plurality of thermopiles, and wherein the plurality of thermopiles comprises alternating p-type and n-type doped portions of a polysilicon member formed on the semiconductor substrate in serpentine pattern extending around the electronic device.

21. An integrated circuit, comprising:
an electronic device formed in and/or over a semiconductor substrate, wherein the electronic device is one of a plurality of electronic devices each formed in and/or over the semiconductor substrate; and
a thermoelectric circuit including a plurality of thermopiles formed in and/or over the semiconductor substrate and electrically connected in series, wherein the thermoelectric circuit is configured to modulate operation of the electronic device in response to a potential produced by the plurality of thermopiles, wherein:
the thermoelectric circuit is one of a plurality of thermoelectric circuits each surrounding a corresponding one of the electronic devices;
each thermoelectric circuit is configured to reduce a voltage to a control terminal of the electronic device surrounded by that thermoelectric circuit in response to heating of that electronic device caused by operation of that electronic device and neighboring others of the electronic devices, wherein:
    the plurality of thermoelectric circuits comprises a plurality of first thermoelectric circuits and a plurality of second thermoelectric circuits;
    the first thermoelectric circuits each include an instance of the plurality of thermopiles connected in series around the corresponding one of the electronic devices; and
    the second thermoelectric circuits each include one of the thermopiles of each first thermoelectric circuit neighboring that second thermoelectric circuit.

* * * * *